United States Patent
Ishimi et al.

(10) Patent No.: US 6,184,753 B1
(45) Date of Patent: Feb. 6, 2001

(54) CLOCK DELAY CIRCUITRY PRODUCING CLOCK DELAYS LESS THAN THE SHORTEST DELAY ELEMENT

(75) Inventors: Kouichi Ishimi; Kazuyuki Ishikawa, both of Tokyo (JP)

(73) Assignee: Mitsubishi Denki Kabushiki Kaisha, Tokyo (JP)

(*) Notice: Under 35 U.S.C. 154(b), the term of this patent shall be extended for 0 days.

(21) Appl. No.: 09/082,474

(22) Filed: May 21, 1998

(30) Foreign Application Priority Data

Dec. 15, 1997 (JP) ..................................... 9-345621

(51) Int. Cl.[7] ................................................. H03K 5/159
(52) U.S. Cl. ......................... 331/34; 331/1 A; 327/261; 327/269; 327/270; 327/159; 327/160
(58) Field of Search ..................................... 327/276, 261, 327/269, 158, 159, 270, 160; 331/34, 1 A

(56) References Cited

U.S. PATENT DOCUMENTS 5,180,937 * 1/1993 Laird et al. .
5,682,114 * 10/1997 Ohta ..................................... 327/276

OTHER PUBLICATIONS

Kouichi Ishimi et al., "A Full–Digital PLL For Low Voltage LSIs", Technical Report Of IEICE, ED97–45, SDM97–23, ICD97–35, Jun. 1997, pp. 29–36.

Wai Lee et al., "A 1V DSP for Wireless Communications", ISSCC97 Digest Of Technical Papers, pp. 92–93, Feb. 6, 1997, pp. 92–93.

Michel Combes et al., "A Portable Clock Multiplier Generator Using Digital CMOS Standard Cells", IEEE Journal of Solid–State Circuits, vol. 31, No. 7, Jul. 1996, pp. 958–965.

* cited by examiner

Primary Examiner—Arnold Kinkead
(74) Attorney, Agent, or Firm—Burns, Doane, Swecker & Mathis, LLP

(57) ABSTRACT

A oscillation circuit has a delay loop with a clock delay circuit for generating a delayed clock signal. The clock delay circuit has a selector and has multiple delay elements with delay times differing from each other. The clock delay circuit may produce a time lag which is less than the delay time of any single delay element, the time lag being based on the difference between the time delays of different delay elements. A phase comparator compares the phase of a signal associated the delay loop to that of a reference clock signal, generating a phase difference clock signal. A delay setting circuit can cause the selector to change the selection of one delayed clock signal according to the phase difference signal from the phase comparator in such a manner as to reduce the phase difference.

20 Claims, 13 Drawing Sheets

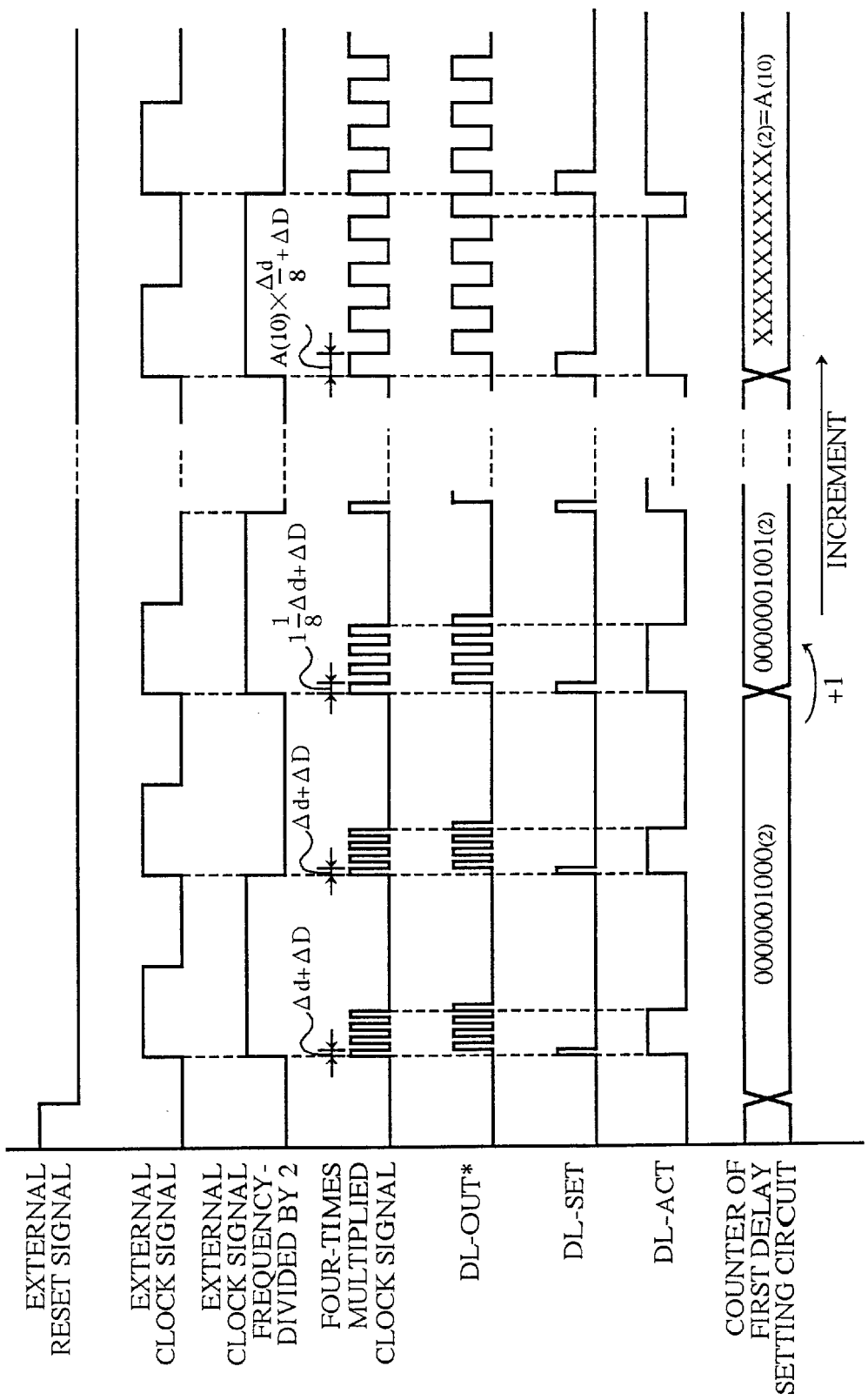

CLOCK DELAY CIRCUITRY PRODUCING CLOCK DELAYS LESS THAN THE SHORTEST DELAY ELEMENT

BACKGROUND OF THE INVENTION

1. Field of the Invention

The present invention relates to clock delay circuitry incorporated into integrated circuits or the like and suitable for generating an internal clock signal in synchronization with an external clock signal applied thereto, and to oscillation circuitry, phase synchronization circuitry, and clock generating circuitry using the clock delay circuitry. More particularly, it relates to clock delay circuitry capable of setting and providing a time delay in steps of a specified time interval which cannot be restricted by a minimum of time delays provided by discrete circuit elements and transistors, and which is less than the minimum time delay, and to an oscillation circuit, a phase locked loop, and a clock generating circuit using the clock delay circuit.

2. Description of the Prior Art

Referring now to FIG. 11, there is illustrated a block diagram showing a clock generating circuit which can be contained on integrated circuits, as disclosed by "A Full-Digital PLL for LOW Voltage LSIs", TECHNICAL REPORT OF IEICE, Vol. 97, No. 106, pp. 29–36, June, 1997. In the figure, reference numeral 12 denotes an oscillation circuit for multiplying the frequency of a reference clock signal applied thereto and for furnishing a multiplied clock signal having the multiplied frequency, and 13 denotes a phase synchronization circuit for delaying the multiplied clock signal from the oscillation circuit 12 by a specified time interval and for furnishing a phase locked clock signal exactly in phase with the reference clock signal.

Reference numeral 14 denotes a loop inverter for inverting the multiplied clock signal, 16 denotes a first digital delay line (DLL) for delaying the output of the loop inverter 14 by a specified time interval defined by a delay setting signal applied thereto, and 51 denotes a delay adjustment circuit for delaying the output of the first DLL by a specified time interval defined by a delay setting signal applied thereto and for furnishing its output to the phase synchronization circuit 13 as the multiplied clock signal. Hereafter, the delay loop constructed of these circuits 14, 16, and 51 is referred to as multiplication delay loop.

Furthermore, reference numeral 19 denotes a first phase comparator which accepts the multiplied clock signal from the delay adjustment circuit 51 and the reference clock signal and then compares the phase of the reference clock signal with that of the multiplied clock signal so as to generate a first phase difference signal indicating the phase difference between the multiplied clock signal and the reference clock signal, and 20 denotes a first delay time setting circuit for generating and furnishing first delay setting signals each having a value that depends on the phase difference indicated by the first phase difference signal from the first phase comparator 19 to both the first DLL 16 and the delay adjustment circuit 51. The oscillation circuit 12 is thus comprised of the loop inverter 14, the first DDL 16, the delay adjustment circuit 51, the first phase comparator 19, and the first delay setting circuit 20.

Reference numeral 24 denotes a second digital delay line or DDL comprised of a plurality of delay elements in series, for delaying the multiplied clock signal from the delay adjustment circuit 51 by a specified time interval defined by a delay setting signal applied thereto and for generating a phase locked clock signal in phase with the reference clock signal, 26 denotes a second phase comparator which accepts the reference clock signal and the phase locked clock signal from the second DDL 24 and compares the phase of the reference clock signal and that of the phase locked clock signal so as to generate a second phase difference signal indicating the phase difference between these clock signals, and 27 denotes a second delay setting circuit for generating and furnishing a second delay setting signal having a value defined by the second phase difference signal from the second phase comparator 26 to the second DDL 24 to set the time delay to be provided by the second DDL 24. The phase synchronization circuit 13 is thus comprised of the second DDL 24, the second phase comparator 26, and the second delay setting circuit 27.

Referring next to FIG. 12, there is illustrated a schematic circuit diagram showing the structures of the delay adjustment circuit 51 and the first DDL 16. In the figure, reference numeral 52 denotes a DDL delay element which constructs part of the first DDL 16, 53 denotes an delay adjustment element which provides the same time delay as each of the plurality of delay elements 52, and 54 denotes an output selector which accepts both the output of the first DDL 16 and the output of the delay adjustment element 53 and then selects and furnishes one of them according to a switching signal applied thereto. Like the first DDL 16, the second DDL 24 includes a plurality of DDL delay elements 52 in series.

In operation, when the loop inverter 14 receives a falling edge of the multiplied clock signal from the delay adjustment circuit 51, the delay adjustment circuit 51 will furnish a rising edge of the multiplied clock signal after the expiration of a predetermined time interval. Similarly, when the loop inverter 14 receives a rising edge of the multiplied clock signal from the delay adjustment circuit 51, the delay adjustment circuit 51 will furnish a falling edge of the multiplied clock signal after the expiration of a predetermined time interval. The multiplied clock signal generated by the multiplication delay loop, which is constructed of the loop inverter 14, the first DDL 16, and the delay adjustment circuit 51, is thus a clock signal in which a transition from HIGH to LOW or from LOW to HIGH is repeated at established intervals having the same length as the time delay produced by the multiplication delay loop, with the result that the multiplied clock signal from the delay adjustment circuit 51 has a period two times as long as the time delay provided by the multiplication delay loop.

When the oscillation circuit 12 receives the reference clock signal while the multiplication delay loop, which is constructed of the loop inverter 14, the first DDL 16, and the delay adjustment circuit 51, operates in this manner, the first phase comparator 19 compares the phase of the reference clock signal with that of the multiplied clock signal from the delay adjustment circuit 51 and then generates a first phase difference signal indicating the phase difference between these signals. The first delay setting circuit 20 then generates first delay setting signals for setting the respective time delays produced by the first DDL 16 and the delay adjustment circuit 51 so as to reduce the phase difference.

Referring next to FIG. 13, there is illustrated a timing diagram showing an example of the operation of the prior art oscillation circuit 12. In the example shown in FIG. 13, the frequency of the multiplied clock signal is set to be four times as large as that of the reference clock signal. As shown in FIG. 13, a switching signal for causing the output selector 54 to switch the selection from the output of the first DDL 16 to the output of the delay adjustment element 53 is applied to the output selector 54 of the delay adjustment circuit 51 after the expiration of a three quarters part of the pulse duration of the reference clock signal since the rising edge of the reference clock signal. As a result, the time delay caused by the multiplication delay loop is changed to $\{(n+1) \times \Delta d\}$, where $\Delta d$ is the time delay provided by either one of each delay element 52 and the delay adjustment element 53, and $n \times \Delta d$ is the immediately previous time delay caused by the multiplication delay loop.

As previously explained, the prior art oscillation circuit 12 can generate a multiplied clock signal having a frequency four times as large as that of a reference clock signal applied thereto by providing a delay adjustment circuit including a delay adjustment element 53 producing the same time delay as caused by each DDL delay element 52, and switching the selection by the selector 54 of the delay adjustment circuit 51 from the output of a first DDL 16 including a plurality of DDL delay elements 52 to the output of the delay adjustment element 53 within one period of the reference clock signal since the rising edge of the reference clock signal.

When the phase synchronization circuit 13 then receives the multiplied clock signal from the oscillation circuit 12, the second DDL 24 delays the multiplied clock signal by a specified time interval and the second phase comparator 26 then compares the phase of the multiplied clock signal delayed by the second DDL with that of the reference clock signal so as to generate a second phase difference signal having a value corresponding to the difference between the phases of the multiplied clock signal delayed and the reference clock signal. The second delay time setting circuit 27 then sets the time delay to be caused by the second DDL 24 so as to reduce the phase difference indicated by the phase difference signal from the second phase comparator 26. Thus the phase synchronization circuit 13 generates a phase locked clock signal in phase with the reference clock signal finally.

As previously mentioned, the prior art clock generating circuit can generate a multiplied clock signal having a frequency four times as large as that of a reference clock signal by means of the oscillation circuit 12, and make the multiplied clock signal in phase with the reference clock signal or anther clock signal associated with the reference clock signal by means of the phase synchronization circuit 13, so that the prior art clock generating circuit can generate a phase clocked clock signal having a frequency four times as large as that of the reference clock signal and synchronized with the reference clock signal or another clock signal. Referring next to FIG. 14, there is illustrated a timing diagram showing the mutual timing among multiplied and phase locked clock signals generated by the prior art clock generating circuit, and a reference clock signal.

Providing the delay adjustment circuit 51 and switching the selection by the delay adjustment circuit 51 from the output of the first DDL 16 to the output of the delay adjustment element 53 within one period of the reference clock signal since the rising edge of the reference clock signal, the multiplied clock signal can be finely synchronized with the reference clock signal compared with a prior art clock generating circuit in which where the time delay to be provided by the delay loop is adjusted by using only the first DDL 16. For example, when multiplying the frequency of the reference clock signal by 4, the synchronization of the multiplied clock signal must be done in delay steps of $(4 \times 2 \times \Delta d = 8 \times \Delta d)$, where the time delay caused by each delay element 52 is $\Delta d$ and the time delay caused by the delay adjustment element 53 is also $\Delta d$, in case that only the first DDL 16 is used for the delay adjustment. On the contrary, in case that the delay adjustment by the delay adjustment circuit 51 is combined with that by the first DDL 16, the synchronization of the multiplied clock signal can be done by adjusting the time delay produced by the multiplication delay loop in delay steps of $\Delta d$.

In such the prior art clock generating circuit so constructed, it is required to cause the delay adjustment circuit 51 to switch the selection within the time delay caused by the multiplication delay loop for the synchronization of the multiplied clock signal with the reference clock signal by means of the delay adjustment circuit 51, and it is therefore to speed up the whole of switching control circuitry, which includes such as the first delay time setting circuit 20, for controlling the delay adjustment circuit 51. In other words, the operating speed of the whole of switching control circuitry limits the minimum delay caused by the multiplication delay loop. This limitation further limits the multiplication factor provided by the multiplication delay loop.

In addition, since the delay adjustment circuit 51 is caused to change the output selection within the total time delay caused by the first DDL 16 and the delay adjustment circuit 51 of the multiplication delay loop for the synchronization of the multiplied clock signal with the reference clock signal, the pulse duration of the multiplied clock signal is varied by the adjustable delay time of $\Delta d$ by the delay adjustment circuit 51, that is, the period of the multiplied clock signal is varied by $(2 \times \Delta d)$, resulting in a very large amount of jitter in the multiplied clock signal. A similar problem is caused when applying such the delay adjustment circuit 51 to the phase synchronization circuit 13.

To solve the above problem, a measure can be taken for adjusting the time delay by using a phase-locked loop or PLL as disclosed in "A 1V DSP for Wireless Communication", Wai Lee et al., ISSCC97, Digest of Technical Papers, pp. 92–93, issued on Feb. 6, 1997. Referring next to FIG. 15, there is illustrated a block diagram showing a phase-locked loop as disclosed in the reference mentioned above. In the figure, reference numeral 55 denotes a NAND gate which accepts an enable signal for controlling the operation of the NAND gate and its output fed back thereinto, 56 denotes a capacitor having a terminal connected to the output of the NAND gate 55, and 56 denotes an inverter connected to the other terminal of the corresponding capacitor 56, for holding the other terminal of the capacitor 56 at a HIGH or LOW logic level.

In operation, when the enable signal makes a LOW to HIGH transition while the output of the NAND gate 55 is held at a HIGH logic level, the output of the NAND gate 55 makes a HIGH to LOW transition. After that, the output of the NAND gate 55 will make a LOW to HIGH transition after the expiration of a specified time delay caused by itself. The NAND gate 55 thus repeats such transitions and generates a clock signal with a pulse duration having the same length as the time delay caused by the NAND gate 55.

After the outputs of the plurality of inverters 57 make a HIGH to LOW transition while the NAND gate 55 furnishes a clock signal, the plurality of capacitors 56 connected to the output of the NAND gate 55 become charged once the output of the NAND gate 55 makes a LOW to HIGH transition, and the plurality of capacitors 56 become discharged once the output of the NAND gate 55 makes a HIGH to LOW transition. As a result, a period of time that elapses from the output level of the NAND gate 55 starts changing until it reaches the threshold level of the NAND gate 55 is varied and the period of the clock signal is therefore varied. By applying the technique to the feedback loop of the prior art oscillation circuit 12 as shown in FIG. 11, the frequency of the multiplied clock signal can be adjusted finely.

The delay time adjustment by adjusting the capacitance connected to the output of the NAND gate 55 by controlling the signal level at one terminal of each of the plurality of capacitors 56 connected in parallel to the output of the NAND gate 55, however, results in a reduction in the speed of variations in signal level at the output of the NAND gate 55. Accordingly, the mixing of a noise into a signal generated by the feedback loop causes variations in the time at which the output of the NAND gate connected to the plurality of capacitors or delay element reaches its threshold voltage, resulting in an unstable oscillation frequency.

In case that the capacitance range of adjustment by controlling the signal level at one terminal of each of the plurality of capacitors 56 is limited to prevent the oscillation frequency from becoming unstable, the range of adjustment must become narrower so that the delay circuit is not adaptable to a wide range of frequency. Furthermore, such the limitation of the capacitance range of adjustment causes a problem that it is difficult to set the time delay caused by the delay circuit as shown in FIG. 15 to within a desired range due to variations in the ambient temperature and variations in the manufacturing process, in the worst case, the time delay cannot be adjusted.

Therefore, even though the above technique is implemented by using a digital delay line, it cannot take advantage of the benefits of the technique and causes a difficulty in making the oscillation frequency of the multiplied clock signal stable.

SUMMARY OF THE INVENTION

The present invention is made to overcome the above problems. It is therefore an object of the present invention to provide a clock delay circuit, which can be incorporated into a feedback loop including a digital delay line, capable of finely adjusting the frequency of a clock signal generated by the feedback loop and finely adjusting the phase of the clock signal with respect to a reference clock signal, and an oscillation circuit, a phase synchronization circuit, and a clock generating circuit using the clock delay circuit.

In accordance with one aspect of the present invention, there is provided clock delay circuitry comprising: a plurality of delay elements each for delaying an identical clock signal applied thereto by a specified time delay which differs from other time delays provided by the others of the plurality of delay elements so as to generate a delayed clock signal; and a selector for selecting one delayed clock signal from among the plurality of delayed clock signals from the plurality of delay elements, the plurality of time delays provided by the plurality of delay elements being set such that a time lag between any two successive delayed clock signals generated by the plurality of delay elements is less than the shortest one of the plurality of time delays provided by the plurality of delay elements.

In accordance with a preferred embodiment of the present invention, the clock delay circuitry further comprises a limit delay element connected in parallel with the plurality of delay elements thereof, for delaying the same signal as entered into the plurality of delay elements by a specified time delay which is slightly greater than the longest one of the plurality of time delays provided by the plurality of delay elements, and a selecting circuit for selecting and furnishing, from one delayed clock signal selected by the selector and the clock signal delayed by the limit delay element, the one which has entered thereto earlier than the other one.

Preferably, the plurality of times delays provided by the plurality of delay elements are predetermined such that they increase in steps of a length of time obtained by dividing the length of a predetermined time interval by the number of the plurality of delay elements.

In accordance with another aspect of the present invention, there is provided oscillation circuitry comprising: a delay loop into which a clock signal furnished by itself is fed back, the delay loop including a clock delay circuit provided with a plurality of delay elements each for delaying either a signal associated with the clock signal fed back into the delay loop or the clock signal fed back into the delay loop by a specified time delay which differs from other time delays provided by the others of the plurality of delay elements so as to generate a delayed clock signal, and a selector for selecting one delayed clock signal from among the plurality of delayed clock signals from the plurality of delay elements, the plurality of time delays provided by the plurality of delay elements being set such that a time lag between any two successive delayed clock signals generated by the plurality of delay elements is less than the shortest one of the plurality of time delays provided by the plurality of delay elements; a phase comparator for comparing the phase of a signal associated with an output of the delay loop with that of a reference clock signal applied thereto so as to generate a phase difference clock signal indicating the phase difference between them; and a delay setting circuit for causing the selector to change a selection of one delayed clock signal according to the phase difference signal from the phase comparator in such a manner as to reduce the phase difference.

Preferably, the delay loop further includes a digital delay line connected in series to the clock delay circuit and provided with a plurality of delay elements in series, for delaying a signal associated with the clock signal fed back into the delay loop, the clock signal fed back into the delay loop, or the delayed clock signal from the clock delay circuit by a variable time delay, so that the clock signal fed back into the delay loop is delayed by at least the time delays provided by the digital delay line and the clock delay circuit. Furthermore, the delay setting circuit can also set the variable time delay to be provided by the digital delay line according to the phase difference signal from the phase comparator in such a manner as to reduce the phase difference.

Both the plurality of delay elements included in the digital delay line and the plurality of delay elements included in the clock delay circuit can be formed using an identical semiconductor process.

Preferably, a difference between the longest and shortest ones of the plurality of time delays provided by the plurality of delay elements included in the clock delay circuit is equal to or less than the smallest variation in the variable time delay provided by the digital delay line or the delay step of the digital delay line.

Preferably, the clock delay circuit includes a limit delay element connected in parallel with the plurality of delay elements thereof, for delaying the same signal as entered into the plurality of delay elements of the clock delay circuit by a specified time delay which is equal to or less than the sum of the smallest variation in the variable time delay provided by the digital delay line or the delay step of the digital delay line and the shortest one of the plurality of time delays provided by the plurality of delay elements included in the clock delay circuit, and a selecting circuit for selecting and furnishing, from one delayed clock signal selected by the selector and the clock signal delayed by the limit delay element, the one which has entered thereto earlier than the other one.

The delay setting circuit can include a counter which can increment or decrement itself according to the phase difference signal from the phase comparator, and causes the selector to change a selection of one delayed clock signal according to the value of lowermost bits of the counter and sets the variable time delay to be provided by the digital delay line according to the value of the remaining highmost bits of the counter. The selector can select one delayed clock signal from one of the plurality of delay elements which corresponds to the value of the lowermost bits of the counter, and the digital delay line can delay the clock signal applied thereto by using one or more delay elements thereof the number of which corresponds to the value of the remaining highmost bits of the counter.

Preferably, the plurality of time delays provided by the plurality of delay elements included in the clock delay circuit are predetermined such that they increase in steps of a length of time obtained by dividing the length of a predetermined time interval by the number of the plurality of delay elements.

In accordance with another aspect of the present invention, there is provided phase synchronous circuitry comprising: a delay circuit including a clock delay circuit provided with a plurality of delay elements each for delaying an identical clock signal applied thereto by a specified time delay which differs from other time delays provided by the others of the plurality of delay elements so as to generate a delayed clock signal, and a selector for selecting one delayed clock signal from among the plurality of delayed clock signals generated by the plurality of delay elements, the plurality of time delays provided by the plurality of delay elements being set such that a time lag between any two successive delayed clock signals generated by the plurality of delay elements is less than the shortest one of the plurality of time delays provided by the plurality of delay elements; a phase comparator for comparing the phase of either an output of the delay circuit or a signal associated with the output of the delay circuit with that of a reference clock signal applied thereto so as to generate a phase difference clock signal indicating the phase difference between them; and a delay setting circuit for causing the selector to change a selection of one delayed clock signal according to the phase difference signal from the phase comparator in such a manner as to reduce the phase difference.

Preferably, the delay circuit further includes a digital delay line connected in series to the clock delay circuit and provided with a plurality of delay elements in series, for delaying either the clock signal or the delayed clock signal from the clock delay circuit by a variable time delay, so that the clock signal applied to the delay circuit is delayed by at least the time delays provided by the digital delay line and the clock delay circuit. Furthermore, the delay setting circuit can also set the variable time delay to be provided by the digital delay line according to the phase difference signal from the phase comparator in such a manner as to reduce the phase difference.

Both the plurality of delay elements included in the digital delay line and the plurality of delay elements included in the clock delay circuit can be formed using an identical semiconductor process.

Preferably, a difference between the longest and shortest ones of the plurality of time delays provided by the plurality of delay elements included in the clock delay circuit is equal to or less than the smallest variation in the variable delay provided by the digital delay line or the delay step of the digital delay line.

The clock delay circuit can include a limit delay element connected in parallel with the plurality of delay elements thereof, for delaying the same clock signal as entered into the plurality of delay elements of the clock delay circuit by a specified time delay which is equal to or less than the sum of the smallest variation in the variable time delay provided by the digital delay line or the delay step of the digital delay line and the shortest one of the plurality of time delays provided by the plurality of delay elements included in the clock delay circuit, and a selecting circuit for selecting and furnishing, from one delayed clock signal selected by the selector and the clock signal delayed by the limit delay element, the one which has entered thereto earlier than the other one.

The delay setting circuit can include a counter which can increment or decrement itself according to the phase difference signal from the phase comparator, and causes the selector to change a selection of one delayed clock signal according to the value of lowermost bits of the counter and sets the variable time delay to be provided by the digital delay line according to the value of the remaining highmost bits of the counter. The selector can select one delayed clock signal from one of the plurality of delay elements which corresponds to the value of the lowermost bits of the counter, and the digital delay line can delay the clock signal applied thereto by using one or more delay elements thereof the number of which corresponds to the value of the remaining highmost bits of the counter.

Preferably, the plurality of times delays provided by the plurality of delay elements included in the clock delay circuit are predetermined such that they increase in steps of a length of time obtained by dividing the length of a predetermined time interval by the number of the plurality of delay elements.

Further objects and advantages of the present invention will be apparent from the following description of the preferred embodiments of the invention as illustrated in the accompanying drawings.

BRIEF DESCRIPTION OF THE DRAWINGS

FIG. 3b shows the structure of one DDL element included in FIG. 3a;

FIG. 8 is a timing chart showing the sequence of operation of the clock generating circuitry, which can be built in an integrated circuit, according to the embodiment of the present invention after an external reset signal asserted LOW is applied thereto;

DETAILED DESCRIPTION OF THE PREFERRED EMBODIMENT

Figure 1:
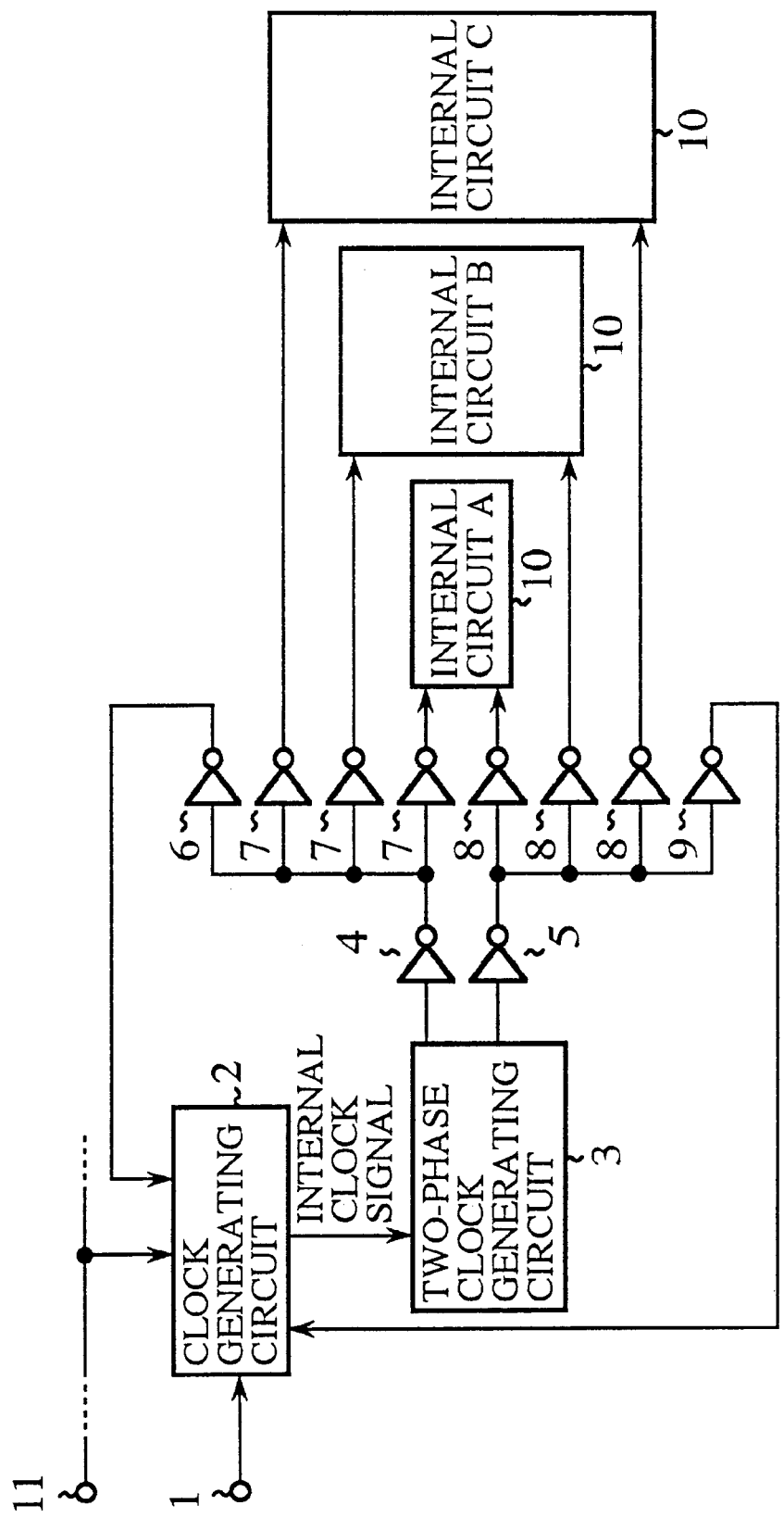
FIG. 1 is a block diagram showing the structure of a clock generating system which can be incorporated into an integrated circuit, according to an embodiment of the present invention.

Referring next to FIG. 1, there is illustrated a block diagram showing the structure of a clock generating system which can be incorporated into an integrated circuit, according to an embodiment of the present invention. The integrated circuit can be formed by using a CMOS semiconductor process. In the figure, reference numeral 1 denotes a clock input terminal through which the clock generating system can accept an external clock signal, which is furnished as a reference clock signal to an oscillation circuit and a phase synchronization circuit of the clock generating system, 2 denotes clock generating circuitry for multiplying the frequency of the external clock signal applied to the clock input terminal 1 to generate an internal clock signal having a frequency which is an exact integral multiple of the input frequency, 3 denotes two-phase clock generating circuitry for inverting the phase of the internal clock signal from the clock generating circuitry 2 to furnish the inverted internal clock signal as well as the internal clock signal applied thereto, 4 and 5 denote preceding inverting amplification buffers for inverting and amplifying the two internal clock signals furnished by the two-phase clock generating circuit 3, respectively, 10 denotes an internal circuit built in the integrated circuit, and 7 and 8 denote inverting amplification buffers, located behind the preceding inverting amplification buffer 4 or 5, for inverting and amplifying the outputs of the inverting amplification buffers 4 and 5 to furnish the internal clock signal and inverted internal clock signal amplified to the internal circuits 10, respectively.

Furthermore, reference numerals 6 and 9 denote inverting amplification buffers for inverting and amplifying the outputs of the preceding inverting amplification buffers 4 and 5 to furnish the inverted and amplified outputs having the same periods as the two internal clock signals distributed to the internal circuits 10 and in phase with them, as feedback clock signals, to the clock generating circuit 2, and 11 denotes a reset input terminal to which an external reset signal is applied.

Figure 2:
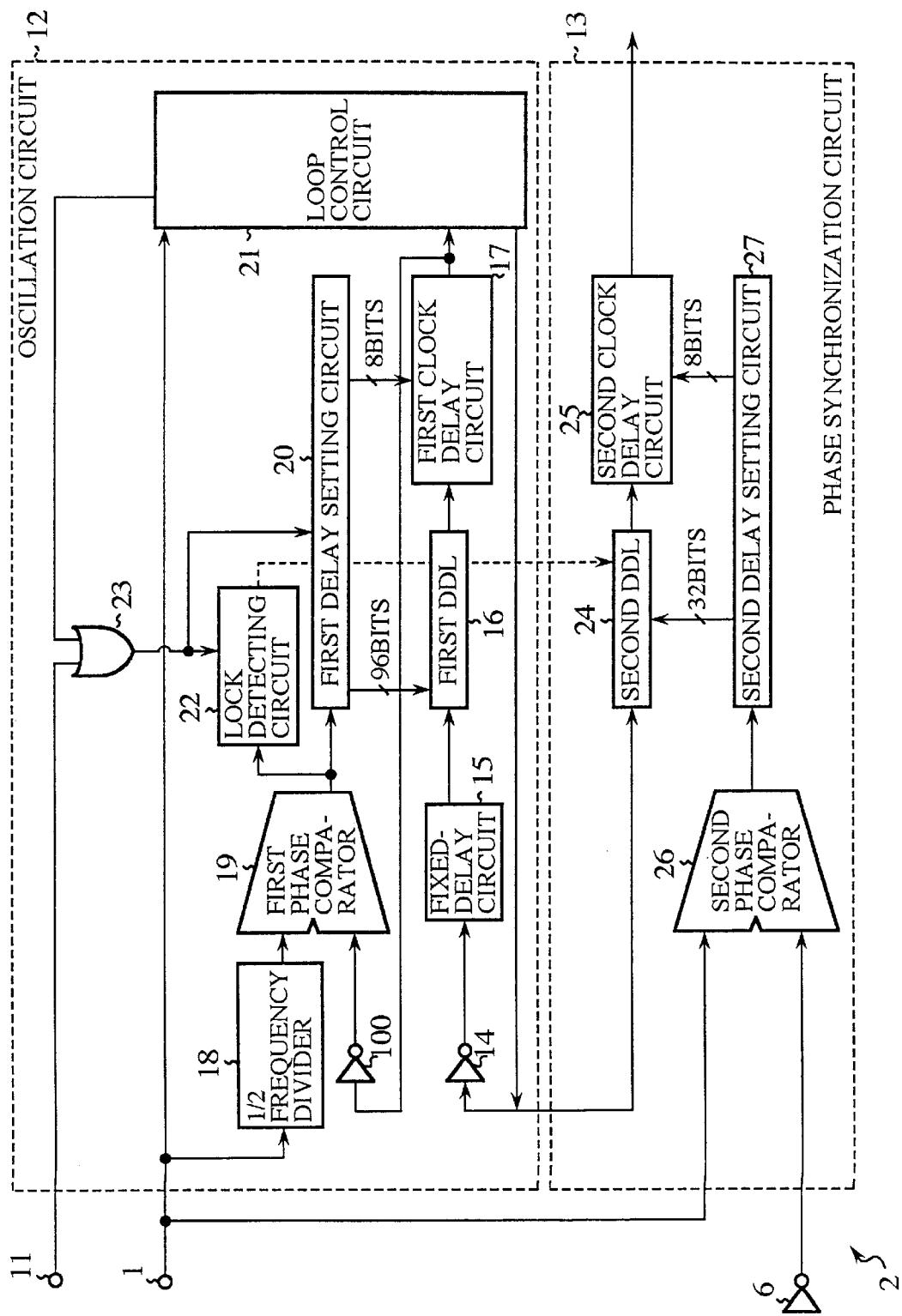
FIG. 2 is a block diagram showing in detail the structure of the clock generating circuit 2 according to the embodiment of the present invention.

Referring next to FIG. 2, there is illustrated a block diagram showing in detail the structure of the clock generating circuit 2 according to the embodiment of the present invention. In the figure, reference numeral 12 denotes an oscillation circuit for multiplying the frequency of the external clock signal applied thereto by way of the clock input terminal 1 so as to generate a multiplied clock signal having a frequency which is an exact integral multiple of the input frequency, and 13 denotes a phase synchronization circuit for delaying the multiplied clock signal from the oscillation circuit 12 by a specified time interval in such a manner that the external clock signal will be in synchronization with the feedback clock signal from the feedback inverting amplification buffer 6, so as to furnish the multiplied clock signal delayed thereby as an internal clock signal to the two-phase clock generating circuit 3.

Reference numeral 14 denotes a loop inverter for inverting the multiplied clock signal applied thereto, 15 denotes a fixed-delay circuit for delaying the output of the loop inverter 14 by a fixed time interval, 16 denotes a first digital delay line or DDL for delaying the output of the fixed-delay circuit 15 by a variable time interval determined by a delay setting signal applied thereto, 17 denotes a first clock delay circuit for delaying the output of the first DDL 16 by a specified time interval determined by a delay setting signal applied thereto, and 21 denotes a loop control circuit which accepts the output of the first clock delay circuit 17 and furnishes the multiplied clock signal to the phase synchronization circuit 13. The delay loop comprised of the loop inverter 14, the fixed-delay circuit 15, the first DDL 16, the first clock delay circuit 17, and the loop control circuit 21 is hereafter referred to as multiplication delay loop in this specification.

Reference numeral 18 denotes a one-half (or ½) frequency divider for dividing the frequency of the external clock signal applied to the clock input terminal 1 by 2 so as to generate a frequency-divided external clock signal having a period two times as long as that of the external clock signal, and 100 denotes an inverter for inverting the output DL-OUT of the first clock delay circuit 17, 19 denotes a first comparator for comparing the phase of the frequency-divided external clock signal with that of the inverted output signal DL-OUT* from the inverter 100 so as to generate a first phase difference signal indicating a phase deviation of the inverted signal DL-OUT* from the phase of the frequency-divided external clock signal, and 20 denotes a first delay setting circuit for generating and furnishing first delay setting signals each having a value determined by the first phase difference signal from the first phase comparator 19 to both the first DDL 16 and the first clock delay circuit 17, respectively.

Reference numeral 22 denotes a lock detecting circuit for monitoring the first phase difference signal from the first phase comparator 19 and for generating a lock signal if the lock detecting circuit 22 determines that the first phase difference signal has not been varied during a predetermined period of time, and 23 denotes an OR gate which accepts an external reset signal applied to the reset input terminal 11 and a forcefully-reset signal from the loop control circuit 21 and furnishes an internal reset signal to both the lock detecting circuit 22 and the first delay setting circuit 20 if at least one of the input signals is asserted HIGH.

Reference numeral 24 denotes a second digital delay line or DDL, responsive to the lock signal from the lock detecting circuit 22, for delaying the multiplied clock signal from the oscillation circuit 12 by a specified time interval determined by a delay setting signal applied thereto, and 25 denotes a second clock delay circuit for delaying the output of the second DDL 24 by a specified time interval determined by a delay setting signal applied thereto and for furnishing the delayed output signal as a phase locked clock signal, i.e., an internal clock signal to the two-phase clock generating circuit 3.

Reference numeral 26 denotes a second phase comparator for comparing the phase of the feedback clock signal from the feedback inverting amplification buffer 6 with that of the external clock signal applied to the clock input terminal 1 so as to furnish a second phase difference signal indicating a phase deviation of the feedback clock signal from the phase of the external clock signal, and 27 denotes a second delay setting circuit for furnishing second delay setting signals each having a value determined by the second phase difference signal from the second phase comparator 26 to both the second DDL 24 and the second clock delay circuit 25, respectively.

Figure 3A:
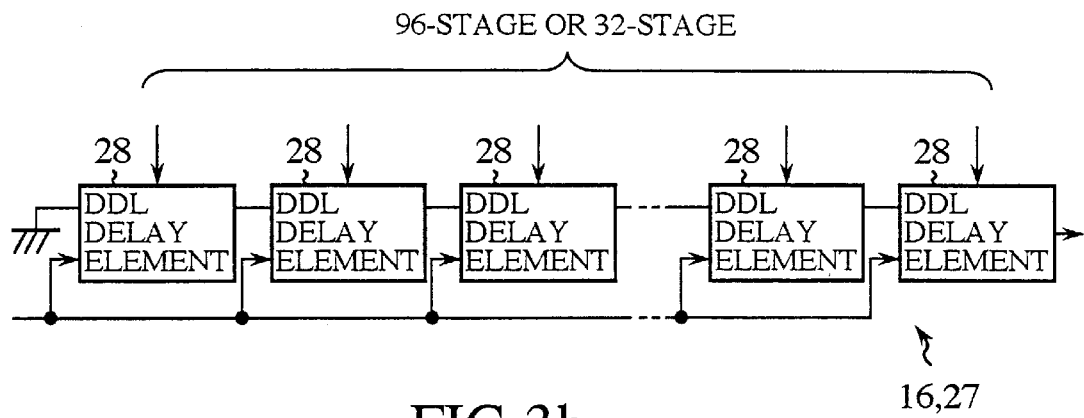
FIG. 3a is a block diagram showing the structure of each of first and second digital delay lines included in the clock generating circuit shown in FIG. 2.

Referring next to FIG. 3a, there is illustrated a block diagram showing the structure of each of the first and second DDLs 6 and 24. In the figure, reference numeral 28 denotes a DDL delay element having an input terminal to which a clock signal is applied, and another input terminal connected to the output of another DDL delay element located at the front thereof if the other DDL delay element exists. One input terminal of the first DDL delay element 28 disposed as the first stage of the DDL is connected to a ground potential instead of the output of another DDL delay element. The first DDL 16 of the embodiment includes 96 DDL delay elements 28 connected in series. The first DDL 27 of the embodiment includes 32 DDL delay elements 28 connected in series.

Figure 3B:
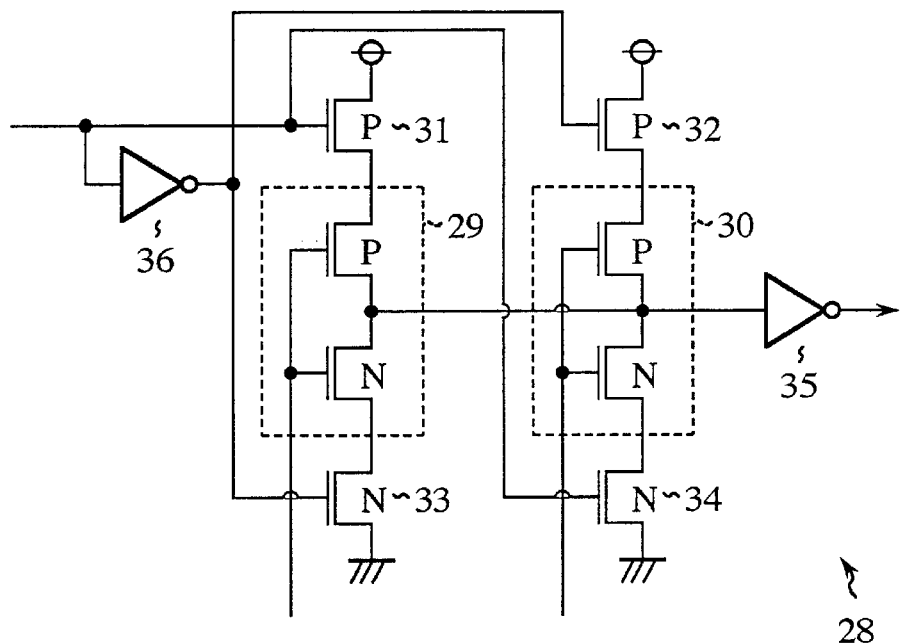

Referring next to FIG. 3b, there is illustrated a schematic circuit diagram showing the structure of one DDL delay element 28 included in the first and second DDLs. In the figure, reference numerals 29 and 30 denote CMOS inverters each for inverting an input signal, 36 denotes an inverter for inverting a delay setting signal from the delay setting circuit 20 or 27, 31 denotes a first P-channel transistor connected between the CMOS inverter 29 and a high power supply and having its gate to which the delay setting signal is applied, 32 denotes a second P-channel transistor connected between the other CMOS inverter 30 and the high power supply and having its gate to which the delay setting signal inverted by the inverter 36 is applied, 33 denotes a first N-channel transistor connected between the CMOS inverter 29 and a low power supply and having its gate to which the inverted delay setting signal from the inverter 36 is applied, 34 denotes a second N-channel transistor connected between the other CMOS inverter 30 and the low power supply and having its gate to which the delay setting signal is applied, and 35 denotes another inverter having its input to which the outputs of the two CMOS inverters 29 and 30 are applied in common.

In operation, when the delay setting signal applied to one DDL delay element 28 as shown in FIG. 3b makes a HIGH to LOW transition, the first P-channel transistor 31 and the first N-channel transistor 33 are turned on while the second P-channel transistor 32 and the second N-channel transistor 34 are turned off. As a result, the inversion of a clock signal applied to the CMOS inverter 29 is then furnished to the inverter 35, so that the DDL delay element 28 delays the clock signal by a specified time interval which is two times as long as the delay provided by the CMOS inverter. On the contrary, when the delay setting signal applied to one DDL delay element 28 as shown in FIG. 3b makes a LOW to HIGH transition, the second P-channel transistor 32 and the second N-channel transistor 34 are turned on while the first P-channel transistor 31 and the first N-channel transistor 33 are turned off. As a result, the DDL delay element 28 delays a clock signal applied to the other CMOS inverter 30 by a specified time interval which is two times as long as the delay caused by the CMOS inverter. Thus one DDL delay element 28 can delay either the output of an immediately preceding DDL delay element 28 or a clock signal applied to the first or second DDL 16 or 27 by the predetermined time delay according to the level of the delay setting signal applied thereto. Accordingly, each of the first and second DDLs 16 and 27 can delay a clock signal applied thereto by a specified time delay variable in steps of the delay caused by one DDL delay element 28 according to the value of the delay setting signal applied thereto. In other words, the first DDL 16 including 96 DDL delay elements 28 in series can produce a variable time delay which lies in the range of $\Delta d$ to 96 $\Delta d$ in steps of $\Delta d$, where $\Delta d$ is the time delay provided by one DDL delay element 28, i.e., the delay step of the first DDL 16.

Figure 4:
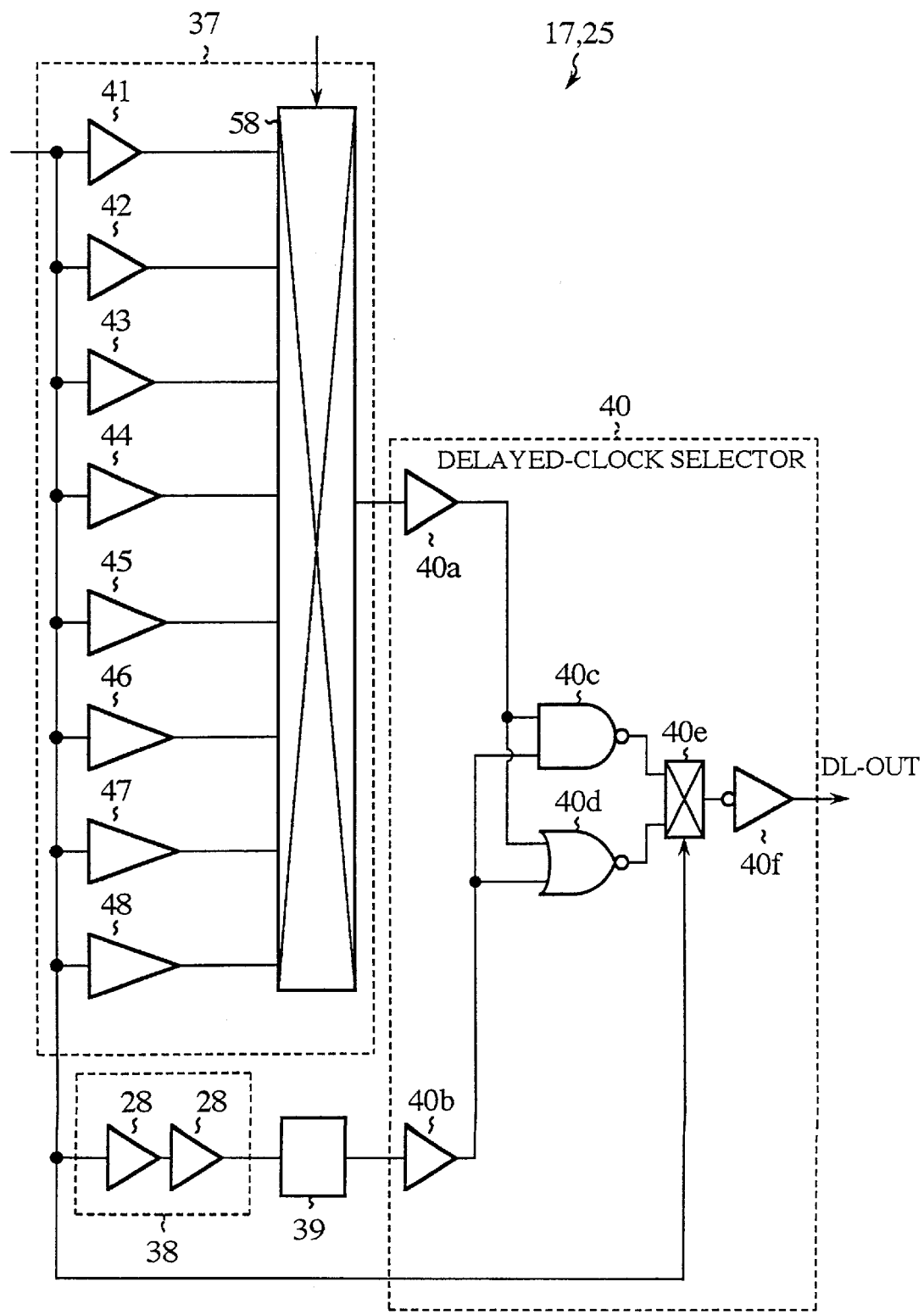
FIG. 4 is a block diagram showing the structure of each of first and second clock delay circuits included in the clock generating circuit shown in FIG. 2.

Referring next to FIG. 4, there is illustrated a block diagram showing the structure of each of the first and second clock delay circuits 17 and 25. In the figure, reference numeral 37 denotes a fine-delay circuit for delaying a clock signal applied thereto by a specified very short or fine delay determined by a delay setting signal applied thereto, 38 denotes a limit delay element provided with two DDL delay elements 28 as shown in FIG. 3b, for delaying the same clock signal as entered into the fine-delay circuit 37 by a specified time interval or delay which is two times as long as the delay caused by one DDL delay element 28, and 40 denotes a delayed-clock selector for selecting and furnishing either the output of the fine-delay circuit 37 or the output of the limit delay element 38.

Each of the first and second delay circuits 17 and 25 of the embodiment can include 8 fine-delay elements 41 through 48 connected in parallel, each for delaying a clock signal applied thereto by a specified time delay. The time delays caused by the plurality of fine-delay elements 41 through 48 differ from each other. Reference numeral 58 denotes a delay adjustment selector for selecting one delayed clock signal which has been delayed by one fine-delay element which produces the time delay corresponding to the value of the delay setting signal applied thereto from among the plurality of delayed clock signals from the plurality of fine-delay elements 41 through 48. Reference numeral 39 denotes a delay circuit for delaying the output of the limit delay element 38 by the same time delay as caused by the delay adjustment selector 58.

Figure 5:
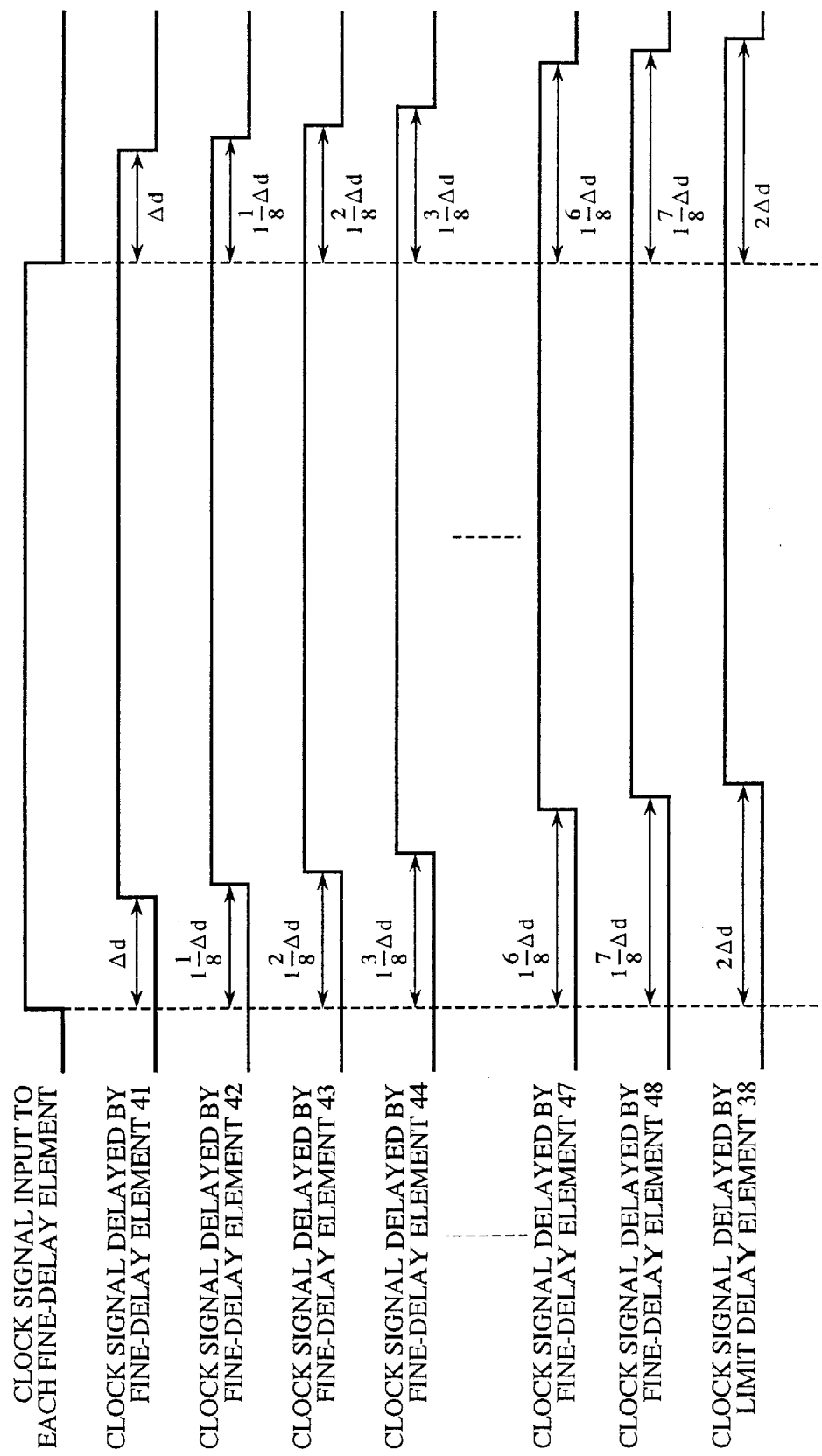
FIG. 5 is a timing chart showing time lags between a clock signal applied to the clock delay circuit of FIG. 4 and clock signals delayed by eight fine-delay elements in parallel and a limit delay element included in the clock delay circuit.

Referring next to FIG. 5, there is illustrated a timing chart showing time lags between a clock signal applied to the clock delay circuit 17 or 25 and clock signals delayed by the first through eighth fine-delay elements 41 through 48 and the limit delay element 38 of the clock delay circuit 17 or 25. In the figure, the first delayed clock signal is the output signal delayed by the first fine-delay circuit 41. The time delay of the output signal produced by the first fine-delay circuit 41 is the smallest one of the time delays provided by the clock delay circuit. Similarly, the second through eighth delayed clock signals are the output signals delayed by the second through eighth fine-delay circuits 42 through 48, respectively. The time delay of the output signal produced by the eighth fine-delay circuit 48 is the largest one of the time delays provided by the fine-delay circuit 37 of the clock delay circuit. As shown in FIG. 5, the time delays provided by the plurality of fine-delay elements 41 through 48 are set such that they range from the time delay of Δd caused by one DDL delay element 28 to less than two times the time delay of Δd, and they increase in steps of one-eighth of the time delay of Δd caused by one DDL delay element 28. In other words, the ith (i=2 to 8) delayed clock signal is further delayed by the predetermined time interval, i.e. the delay step, of (Δd/8) with respect to the (i−1)th delayed signal. The first fine-delay element 41 can delay the input clock signal by the same time delay (Δd) as provided by one DDL delay element 28. Furthermore, the limit delay element 38 can delay the input clock signal by a specified time interval which is two times as long as the time delay of Δd caused by one DDL delay element 28. Thus each of the first and second clock delay circuits 17 and 25 can set its delay time to a value in the range of Δd to (Δd+7Δd/8) in steps of (Δd/8). When forming the clock generating circuit on a CMOS integrated circuit, for example, the gate width and length of transistors included in one delay element and the loads connected to the outputs of the transistors can be adjusted so as to set the time delays to be caused by the plurality of fine-delay elements to desired values as mentioned above. As the gate width is increased, the delay time is shortened. As the gate length is increased, the delay time is lengthened. As the load is increased, the delay time is lengthened.

In FIG. 4, reference numeral 40a denotes an amplification buffer for amplifying the output of the fine-delay circuit 37, 40b denotes another amplification buffer for amplifying the output of the delay circuit 39, 40c denotes a NAND gate for implementing the logical NAND operation on the outputs of the amplification buffers 40a and 40b, 40d denotes a NOR gate for implementing the logical NOR operation on the outputs of the amplification buffers 40a and 40b, 40e denotes a selector for selecting either the output of the NAND gate 40c or the output of the NOR gate 40d according to the level of the clock signal applied to the clock delay circuit, and 40f denotes an output buffer for inverting and amplifying the output of the selector 40e. When the clock signal applied to the clock delay circuit 17 or 25 as shown in FIG. 4 has a HIGH logic level, the selector 40e selects and furnishes the output of the NOR gate 40d to the output buffer 40f. When the clock signal applied to the clock delay circuit 17 or 25 has a LOW logic level, the selector 40e selects and furnishes the output of the NAND gate 40c to the output buffer 40f. Accordingly, the clock delay circuit 17 or 25 furnishes the one of the two clock signals from the fine-delay circuit 37 and the delay circuit 39, whose phase leads the phase of the other one, i.e., which has entered into the delayed-clock selector 40 earlier than the other one, as an output signal DL-OUT by way of the output buffer 40f. Even though variations in temperature, variations in power supply voltage, or variations in CMOS process results in a situation that the time delay caused by the eighth fine-delay element 48 is longer than the delay caused by the two DDL delay elements 28, the phase of the clock signal furnished by the clock delay circuit cannot be further varied by the delay time caused one DDL delay element 28 or more.

Figure 6:
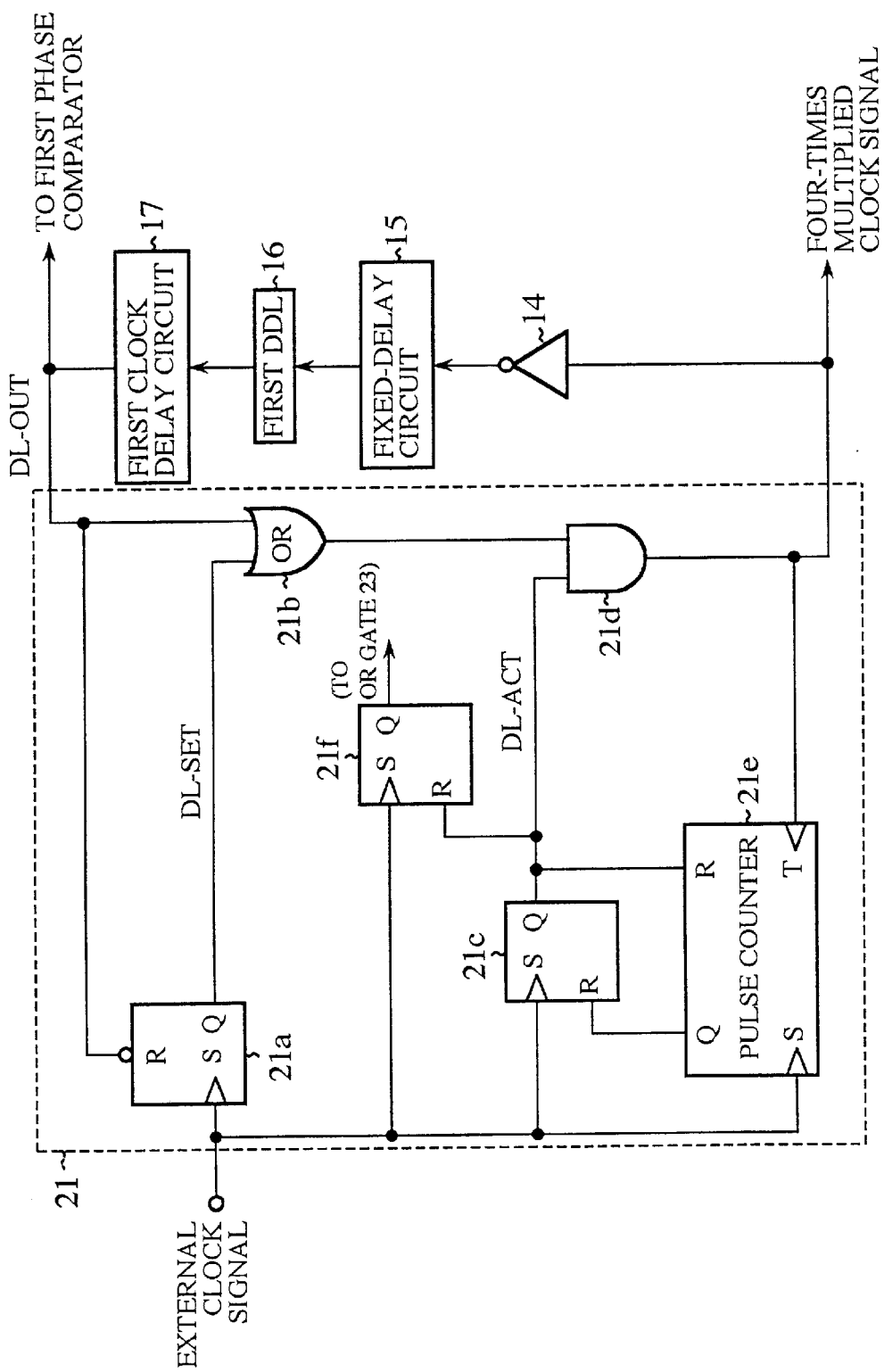
FIG. 6 is a block diagram showing the structure of a loop control circuit of the clock generating circuitry of the embodiment and its peripheral circuits.

Referring next to FIG. 6, there is illustrated a block diagram showing the structure of the loop control circuit 21 of the embodiment and its peripheral circuits. In the figure, reference numeral 21a denotes a fist flip-flop for furnishing a delay start signal DL-SET asserted HIGH in response to a rising edge of the external clock signal and for, after that, causing the delay start signal DL-SET to make a HIGH to LOW transition when the output DL-OUT of the first clock delay circuit 17 makes a HIGH to LOW transition, 21b denotes an OR gate which implements the logical OR operation on the delay start signal DL-SET and the output DL-OUT of the clock delay circuit 17, 21c denotes a second flip-flop for furnishing a delay active signal DL-ACT asserted HIGH in response to a rising edge of the external clock signal, 21d denotes an AND gate for implementing the logical AND operation on the delay active signal DL-ACT and the output of the OR gate 21b, 21e denotes a pulse counter for counting the number of falling edges of the output of the AND gate 21d applied thereto after the pulse counter 21e has received a rising edge of the external clock signal and for furnishing an FF reset signal to the second flip-flop 21c when it reaches a predetermined count value, 4 in this embodiment, and 21f denotes a third flip-flop for latching the level of the delay active signal DL-ACT from the second flip-flop 21c upon a rising edge of the external clock signal and for furnishing a forcefully reset signal having the level latched to the OR gate 23 of the oscillation circuit 12 shown in FIG. 2. When the delay active signal DL-ACT makes a HIGH to LOW transition, the pulse counter 21e is reset.

When the loop control circuit 21 receives a rising edge of the external clock signal, the first flip-flop 21a furnishes a delay start signal DL-SET asserted HIGH. Simultaneously, the second flip-flop 21c furnishes a delay active signal DL-ACT asserted HIGH, and the pulse counter 21e is brought into a state in which it can count falling edges of the output of the AND gate 21d. Accordingly, the OR gate 21b furnishes its output at a HIGH logic level and therefore the AND gate 21d furnishes its output at a HIGH logic level. The output of the loop inverter 14 then makes a HIGH to LOW transition. After that, the output of the fixed-delay circuit 15 makes a HIGH to LOW transition after the expiration of a fixed time delay. The output of the first DDL 16 then makes a HIGH to LOW transition after the expiration of a predetermined time delay. Similarly, the output of the first clock delay circuit 17 then makes a HIGH to LOW transition after the expiration of a predetermined time interval. As a result, the fist flip-flop 21a is reset, and the delay start signal DL-SET makes a HIGH to LOW transition. Then the output of the OR gate 21b makes a HIGH to LOW transition and the output of the AND gate 21d makes a HIGH to LOW transition. The multiplication delay loop thus generates and furnishes a clock pulse having a pulse duration corresponding to the time delay provided by the multiplication delay loop.

In the meantime, the pulse counter 21e counts falling edges of the multiplied clock signal generated by the multiplication delay loop. When the pulse counter 21e reaches 4, it furnishes a reset signal to the second flip-flop 21c. The second flip-flop 21c then causes the delay active signal DE-ACT to make a HIGH to LOW transition, with the result that the multiplication delay loop causes its output to forcedly make a transition to a LOW logic level and then holds its output at a LOW logic level, that is, the multiplication delay loop generates no further clock pulses until the loop control circuit 21 receives the next rising edge of the external clock signal.

Accordingly, the multiplication delay loop generates a clock signal including four clock pulses each having a pulse duration with the same length as the total time delay provided by the multiplication delay loop, and three low-level intervals with the same length as the pulse duration, during a period of time between the instance when the delay start signal DL-SET makes a LOW to HIGH transition and the instance when the delay active signal DL-ACT makes a HIGH to LOW transition. The four-times multiplied clock signal generated in the multiplication delay loop is then furnished to the phase synchronous circuit 2. When the loop control circuit 21 then receives the next rising edge of the external clock signal, the third flip-flop 21f latches the delay active signal DL-ACT and then furnishes a forcefully reset signal having the same level as of the delay active signal latched.

Figure 7:
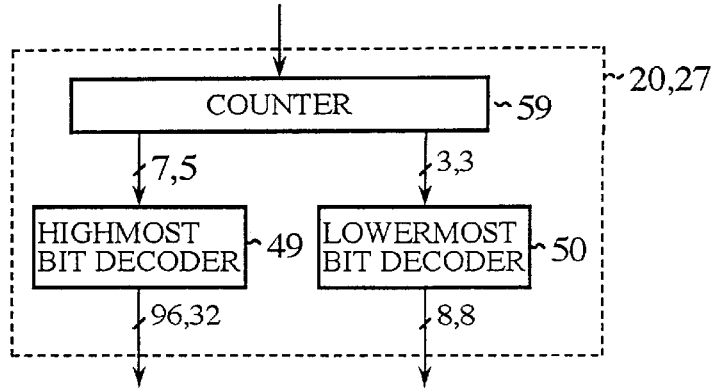
FIG. 7 is a block diagram showing the structure of each of first and second clock delay setting circuits included in the clock generating circuitry shown in FIG. 2.

Referring next to FIG. 7, there is illustrated a block diagram showing the structure of each of the first and second delay setting circuits 20 and 27. In the figure, reference numeral 59 denotes a counter which increments itself by one when the phase difference signal from the first or second phase comparator 19 or 26 as shown in FIG. 2 indicates that the clock signal delayed should be further delayed, and decrements itself by one otherwise, 49 denotes a highmost bit decoder for generating and furnishing a delay setting signal having a value corresponding to highmost bits of the counter 59 to the first or second DDL 16 or 24, and 50 denotes a lowermost bit decoder for generating and furnishing a delay setting signal having a value corresponding to the remaining lowermost bits of the counter 59 to the first or second clock delay circuit 17 or 25. In the first delay setting circuit 20, the counter 59 is a 10-bit counter, and the highmost bit decoder 49 generates a delay setting signal to the first DDL 16 from the highmost seven bits of the 10-bit count and the lowermost bit decoder 50 generates a delay setting signal to the first clock delay circuit 17 from the lowermost three bits of the 10-bit count. In the second delay setting circuit 27, the counter 59 is an 8-bit counter, and the first decoder 49 generates a delay setting signal to the second DDL 24 from the highmost five bits of the 8-bit count and the second decoder 50 generates a delay setting signal to the second clock delay circuit 25 from the lowermost three bits of the 8-bit count.

Referring next to FIG. 8, there is illustrated a timing chart showing the sequence of operation of the clock generating circuitry, which can be built in an integrated circuit, according to the embodiment of the present invention after an external reset signal asserted LOW is applied thereto. As shown in the figure, just after an external reset signal asserted LOW is applied to the clock generating circuitry, the count value of the counter 59 of the first delay setting circuit 20 is set to a 10-bit binary value of 0000001000. After that, when the oscillation circuit 12 receives a rising edge of the external clock signals by way of the clock input terminal 1, the ½ frequency divider 18 divides the frequency of the external clock signal by 2 so as to generate a frequency-divided clock signal having a frequency which is one-half of the input frequency. Simultaneously, the first flip-flop 21a of the loop control circuit 21 furnishes a delay start signal DL-SET asserted HIGH to the OR gate 21b, and the second flip-flop 21c furnishes a delay active signal DL-ACT asserted HIGH to the AND gate 21d. As a result, the output of the AND gate 21d makes a LOW to HIGH transition. The first rising edge of the four-times multiplied clock signal is thus generated.

On the other hand, the highmost-bit decoder 49 of the first delay setting circuit 20 generates and furnishes a delay setting signal to the first DDL 16 from the highmost seven bits of the counter 59, and the lowermost-bit decoder 50 of the first delay setting circuit 20 generates and furnishes a delay setting signal to the first clock delay circuit 17 from the lowermost three bits of the counter 59. As mentioned above, since the count value of the counter 59 is set to a binary value of 0000001000 just after the oscillation circuit 12 is reset, the highmost-bit decoder 49 furnishes a delay setting signal for causing the first DDL 16 to delay the output of the loop inverter 14 by using only one DDL delay element 28. In other words, the highmost-bit decoder 49 sets the variable time delay to be caused by the first DDL 16 to Δd, where Δd is the time delay provided by one DDL delay element 28. On the other hand, the lowermost-bit decoder 50 sets the time delay to be caused by the first clock delay circuit 17 to the shortest time delay, to Δd in this embodiment. Accordingly, the total time delay to be provided by the multiplication delay loop is given by (Δd+ΔD), where Δd is the delay provided by the first DDL 16, and ΔD is the constant time delay provided by the delay loop including the shortest delay by the first clock delay circuit 17, the delay by the fixed-delay circuit 15, and the delays by other components included in the delay loop, except the first DDL 16.

The first rising edge of the four-times multiplied clock signal which has entered to the delay loop is inverted by the loop inverter 14 first; and is then furnished as a falling edge to the fixed-delay circuit 15. After that, the falling edge is delayed by the fixed-delay circuit 15, the first DDL 16, and the first clock delay circuit 17, by the time delay given by (Δd+ΔD), and is then furnished as DL-OUT by the clock delay circuit 17. The output signal DL-OUT which has made a HIGH to LOW transition is inverted by the inverter 100 as shown in FIG. 2, and the inverted signal DL-OUT* is delivered to the first phase comparator 19. The output signal DL-OUT which has made a HIGH to LOW transition is also furnished as the reset signal to first flip-flop 21a. As a result, the delay start signal DL-SET is negated. The output of the OR gate 21b then makes a HIGH to LOW transition and, after that, the output of the AND gate 21d makes a HIGH to LOW transition. As a result, one clock pulse with a pulse duration having the same length as the time delay of (Δd+ΔD) caused by the delay loop is generated in the delay loop. The falling edge of the clock pulse is then furnished to the loop inverter 14, and the above operation is repeated in the delay loop.

Once the pulse counter 21e receives each rising edge of the external clock signal, it starts counting the number of falling edges of the four-times multiplied clock signal furnished by the AND gate 21d. When the pulse counter 21e reaches 4, it resets the second flip-flop 21c so as to cause the delay active signal DL-ACT to make a HIGH to LOW transition, so that the output of the AND gate 21d is held at a logic LOW level until the next rising edge of the external clock signal is entered into the loop control circuit 21. The multiplication delay loop thus stops a further generation of clock pulses. Accordingly, the multiplication delay loop can furnish four periods of the multiplied clock signal within one period of the external clock signal.

The first phase comparator 19 compares the phase of the frequency-divided clock signal from the frequency divider 18 and that of DL-OUT*. For example, the first phase comparator 19 compares the phase of each falling edge of the frequency-divided clock signal and that of the falling edge of the last clock pulse of DL-OUT*. The first phase comparator 19 then furnishes a first phase difference signal indicating the phase difference between them to the first delay setting circuit 20. As shown in FIG. 8, there is a large phase difference between the phase of the falling edge of the frequency-divided clock signal from the frequency divider 18 and that of the falling edge of the last clock pulse of DL-OUT*, just after the oscillation circuit 12 is reset. The counter 59 of the first delay setting circuit 20 increments itself by one according to the first phase difference signal. While the increment does not vary the value of the delay setting signal furnished by the highmost-bit decoder 49, it causes the lowermost-bit decoder 50 to generate and furnish a delay setting signal for causing the selector 58 to select one delayed clock signal from the second fine-delay element 42. As a result, when the third period of the external clock signal begins, the delay time caused by the multiplication delay loop is increased by the difference between the delay caused by the first fine-delay element 41 and the delay caused by the second fine-delay element 42, i.e., the delay step Δd/8 of the first clock delay circuit 17, and hence the period of the multiplied clock signal is increased by 2(Δd/8) or Δd/4.

After that, if the phase of the last falling edge of DL-OUT* still leads that of the falling edge of the frequency-divided clock signal and the phase difference between them is greater than a predetermined phase difference corresponding to a predetermined time interval of Δd/8, the counter 59 of the first delay setting circuit continues to increment itself by one at intervals of two periods of the external clock signal until the phase difference is equal to or less than the predetermined phase difference. As the counter value of the counter 59 is increased, the total time delay caused by the combination of the first DDL 16 and the first clock delay circuit 17 is increased. If a binary number comprised of the lowermost three bits of the counter 59 is n (n=0 to 7) in decimal, the lowermost-bit decoder 50 generates a delay setting signal for causing the selector 58 to select one delayed clock signal from the (n+1)th fine-delay element which corresponds to the decimal number n. The highmost-bit decoder 49 generates a delay setting signal for causing the first DDL 16 to delay the input signal by using a plurality of DDL delay elements 28 the number of which is given by a decimal number which corresponds to a binary number comprised of the remaining highmost seven bits of the counter 59. As a result, every time the counter 59 of the first clock delay circuit 17 increments itself by one, the time delay provided by the delay loop is increased by the variation step or delay step Δd/8 of the first clock delay circuit 17. In other words, when the count value of the counter 59 reaches $A_{(10)}$ in decimal, the pulse duration of the four-times clock signal is given by ($A_{(10)} \times \Delta d/8 + \Delta D$).

The counter 59 continues to increment itself by one at intervals of two periods of the external clock signal until the time lag between the falling edge of the frequency-divided external clock signal and the last falling edge of the multiplied clock signal is decreased to the delay step Δd/8 of the first clock delay circuit 17 or less. Once the time lag between the falling edge of the frequency-divided external clock signal and the last falling edge of the multiplied clock signal is reduced to the delay step Δd/8 or less, the counter 59 of the first delay setting circuit 20 holds the current values of the delay setting signals furnished to the first DDL 16 and the first clock delay circuit 17. The total time delay caused by the multiplication delay loop is then held constant. The period of the multiplied clock signal including four clock pulses generated during one period of the external clock signal is thus held constant.

Figure 9:
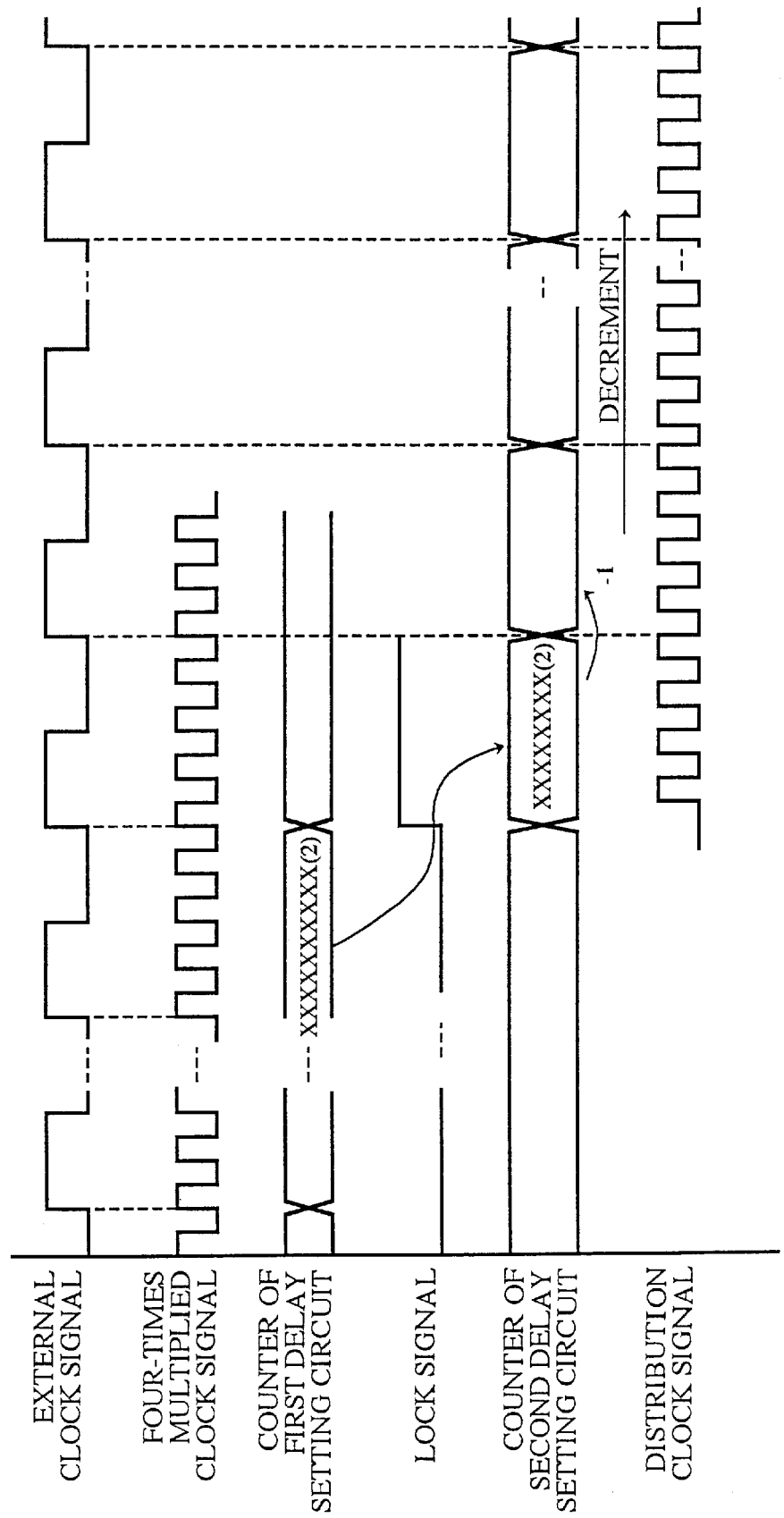
FIG. 9 is a timing chart showing the sequence of operation of the clock generating circuitry according to the embodiment of the present invention after the period of the multiplied clock signal has been held constant.

Referring next to FIG. 9, there is illustrated a timing chart showing the sequence of operation of the clock generating circuitry according to the embodiment of the present invention after the period of the multiplied clock signal has been held constant. As shown in FIG. 9, in case that the count value of the counter 59 of the first delay setting circuit 20 for determining the period of the multiplied clock signal is held constant during a predetermined period of time, for example, during twenty periods of the external clock signal, the lock detecting circuit 22 furnishes a lock signal. In addition, the values of the current lowermost eight bits of the counter 59 of the first delay setting circuit 20 are written into the counter 59 of the second delay setting circuit 27. The second delay setting circuit 27 then generates and furnishes second delay setting signals to the second DDL 24 and the second clock delay circuit 25 from the count value of the counter 59 thereof. As a result, the multiplied clock signal from the multiplication delay loop is delayed by a specified time interval determined by the count value of the counter 59 of the second delay setting circuit 27 by the combination of the second DDL 24 and the second clock delay circuit 25, and is then furnished as an internal clock signal or phase locked clock signal.

After that, when the internal clock signal is fed back into the second phase comparator 26 by way of the two-phase clock generating circuit 3, and the inverting amplification buffers 4, 5, 6 and 9, the second phase comparator 26 compares the phase of the fed-back internal clock signal, which is in phase with clock signals delivered to the plurality of internal circuits 10 as shown in FIG. 1, with that of the external clock signal applied thereto so as to generate and furnish a second phase difference signal indicating the phase difference between them to the second delay setting circuit 27. The counter 59 of the second delay setting circuit 27 decrements or increments itself by one according to the value of the second phase difference signal.

The above operation is repeated and therefore the total time delay caused by the combination of the second DDL 24 and the second clock delay circuit 25 is decreased or increased until the time lag between the external clock signal and the fed-back clock signal is reduced to the delay step Δd/8 of the second clock delay circuit 25 or less. When the time lag between the external clock signal and the fed-back clock signal is reduced to the delay step or less, the total time delay caused by the combination of the second DDL and the second clock delay circuit is then held constant.

Figure 10:
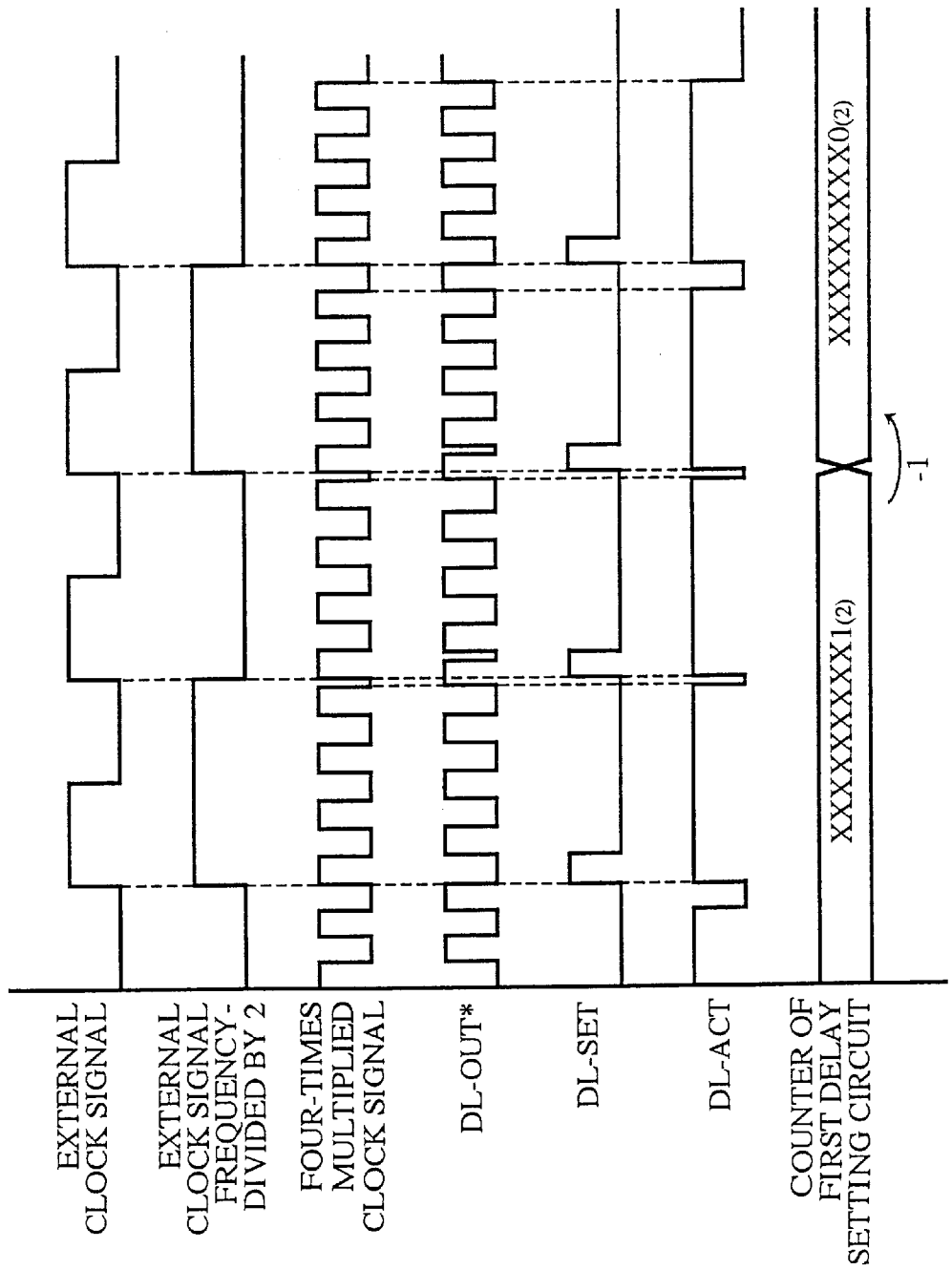
FIG. 10 is a timing chart showing the sequence of operation of the clock generating circuitry according to the embodiment of the present invention when the length of the four periods of the multiplied clock signal is longer than that of the period of the external clock signal.
Figure 11:
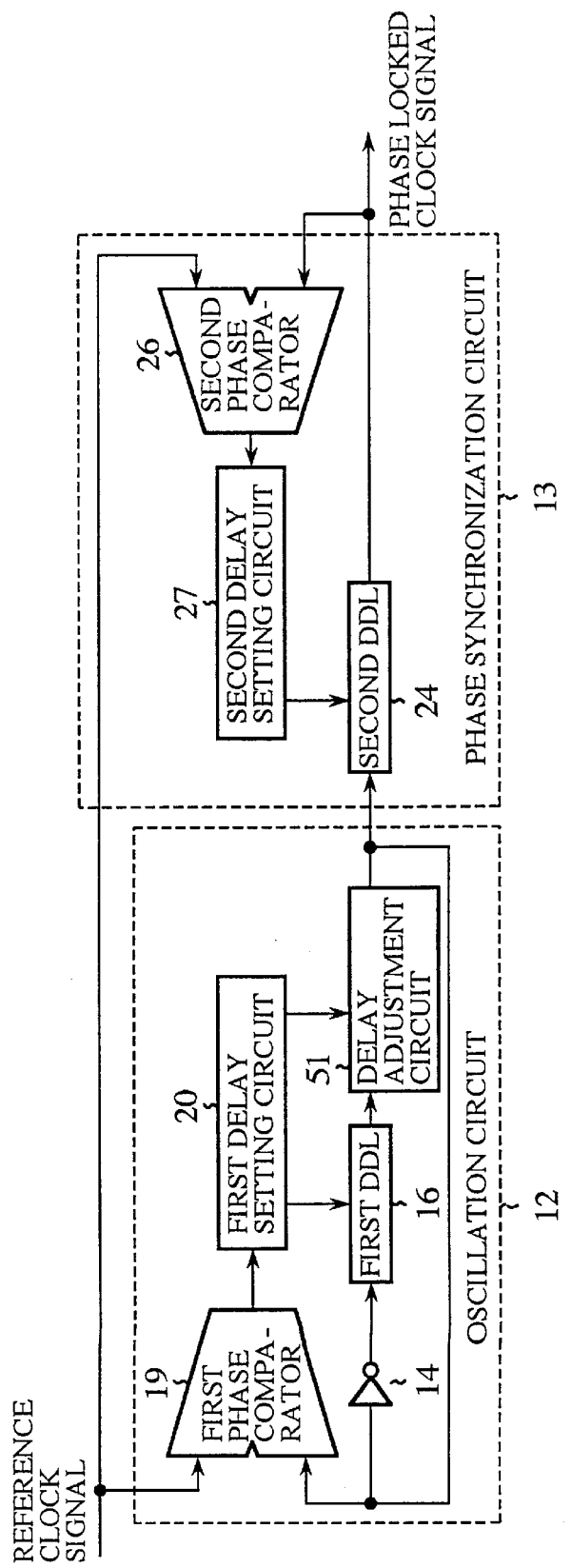
FIG. 11 is a block diagram showing prior art clock generating circuitry.

Referring next to FIG. 10, there is illustrated a timing chart showing the sequence of operation of the clock generating circuitry according to the embodiment of the present invention when the length of the four periods of the multiplied clock signal is longer than that of the period of the external clock signal. It can be considered that variations in component's temperature and ambient temperature and variations in power supply voltage contribute to such an increase in the period of the multiplied clock signal after the total delay time caused by the combination of the first DDL 16 and the first clock delay circuit 17 has been held constant. As shown in FIG. 10, when the length of the four periods of the multiplied clock signal exceeds that of the period of the external clock signal, the first phase comparator 19 detects that the last falling edge of DL-OUT* is delayed with respect to the falling edge of the frequency-divided clock signal from the ½ frequency divider so as to generate a first phase difference signal indicating the phase difference. The first delay setting circuit 20 then causes the counter 48 to decrement itself by one. The counter 59 continues to decrement itself by one at intervals of two periods of the external clock signal until the time lag between the falling edge of the frequency-divided external clock signal and the last falling edge of the multiplied clock signal is decreased to the delay step Δd/8 of the first clock delay circuit 17 or less. Thus the length of the four periods of the multiplied clock signal becomes equal to that of the period of the external clock signal again, so that the clock generating circuitry is made stable.

In a state wherein the length of the four periods of the multiplied clock signal is longer than that of the period of the external clock signal, the third flip-flop 21f of the loop control circuit 21 latches the delay active signal DL-ACT asserted HIGH. The forcefully reset signal is then negated according to the latched level.

Once the lock detecting circuit 22 detects that the clock generating circuitry has become stable, the lock detecting circuit 22 cannot be negated until the external reset signal or the forcefully reset signal is asserted even though the length of the four periods of the multiplied clock signal exceeds that of the period of the external clock signal.

In the aforementioned manner, the clock generating circuit 2 of the embodiment, which can be disposed in an integrated circuit, can furnish a clock signal in phase with an external clock signal applied thereto and having a frequency four times as large as that of the external clock signal to each internal circuit 10 built in the integrated circuit with stability. The integrated circuit thus can operate at a speed four times as high as that of external hardware while it is running in synchronization with the external hardware.

As previously mentioned, the clock delay circuit of the embodiment comprises a plurality of delay elements each for delaying an identical clock signal applied thereto by a specified time delay which differs from other time delays provided by the others of the plurality of delay elements so as to generate a delayed clock signal, and a selector for selecting one delayed clock signal from among the plurality of delayed clock signals from the plurality of delay elements, the plurality of time delays provided by the plurality of delay elements being set such that a time lag between any two successive delayed clock signals generated by the plurality of delay elements is less than the shortest one, e.g. $\Delta d$, of the plurality of time delays provided by the plurality of delay elements. Accordingly, the time delay to be provided by the clock delay circuit can be controlled in steps of a predetermined time interval, for example $\Delta d/8$, which is less than the shortest one, e.g. $\Delta d$, of the plurality of time delays provided by the plurality of delay elements.

Either in a case where a feedback loop such as a multiplication delay loop is constructed by the clock delay circuit which is so constructed as mentioned above or in a case where a feedback loop such as a multiplication delay loop is constructed by a combination of the clock delay circuit which is so constructed as mentioned above and a digital delay line, the time delay to be provided by the feedback loop can be increased or decreased in steps of a predetermined time interval, for example $\Delta d/8$, which is less than the shortest one, e.g. $\Delta d$, of time delays which can be provided by the clock delay circuit, and which is less than the smallest variation, e.g. $\Delta d$, in the variable time delay provided by the digital delay line or the delay step of the digital delay line.

Since the time delay produced by each fine-delay element of the clock delay circuit is fixed and the selector selects one delayed clock signal from among a plurality of delayed clock signals from the plurality of fine-delay elements, the oscillation circuit can maintain the timing with which a clock pulse is furnished into the loop control circuit thereof and so on even though a noise is mixed into the feedback loop such as the multiplication delay loop including the clock delay circuit, with the result that the multiplied clock signal generated by the feedback loop has a stable frequency.

In addition, by adjusting the number of the plurality of fine-delay elements connected in parallel of the clock delay circuit, the largest one of the time delays provided by the clock delay circuit can be increased. Accordingly, the present invention offers the advantages mentioned above throughout a wide range of frequencies, including variations due to variations in the ambient temperature and variations in the manufacturing process, even though the feedback loop is constructed by only the clock delay circuit.

Accordingly, in the oscillation circuit provided with a delay loop including the clock delay circuit which provides the advantages mentioned above, the phase synchronization circuit provided with a feedback loop including the clock delay circuit, and the clock generating circuit including such the oscillation circuit and the phase synchronization circuit, the phase synchronization can be finely adjusted by means of the feedback loop without loss of the frequency stability.

Figure 12:
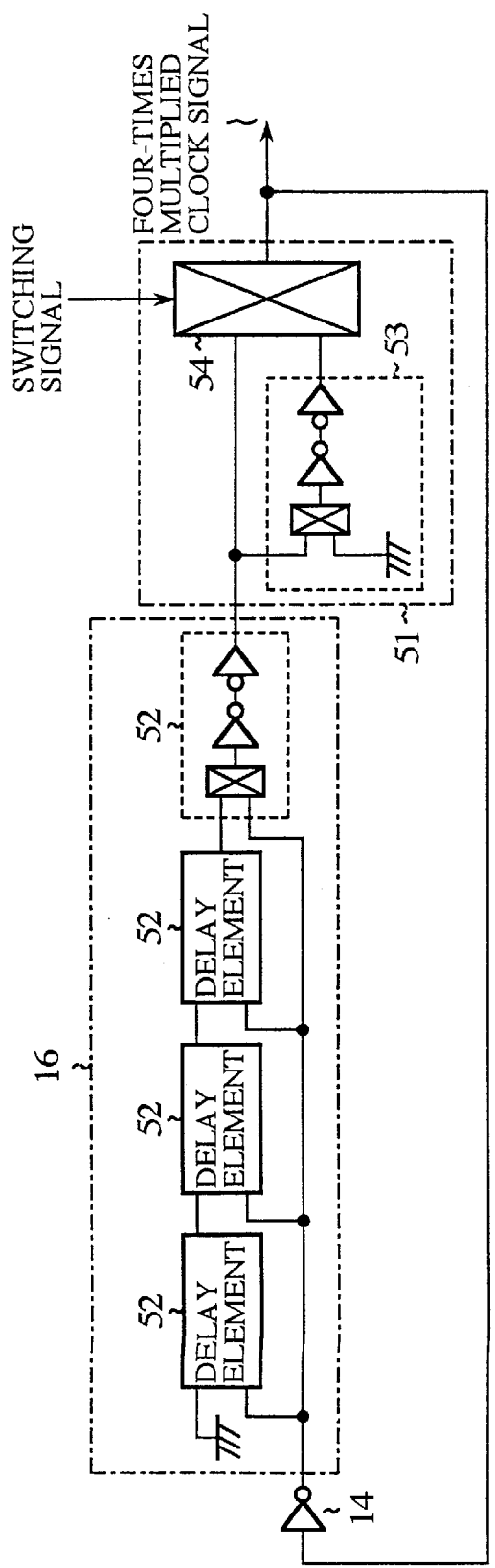
FIG. 12 is a schematic circuit diagram showing the structure of a prior art delay adjustment circuit and a digital delay line.
Figure 13:
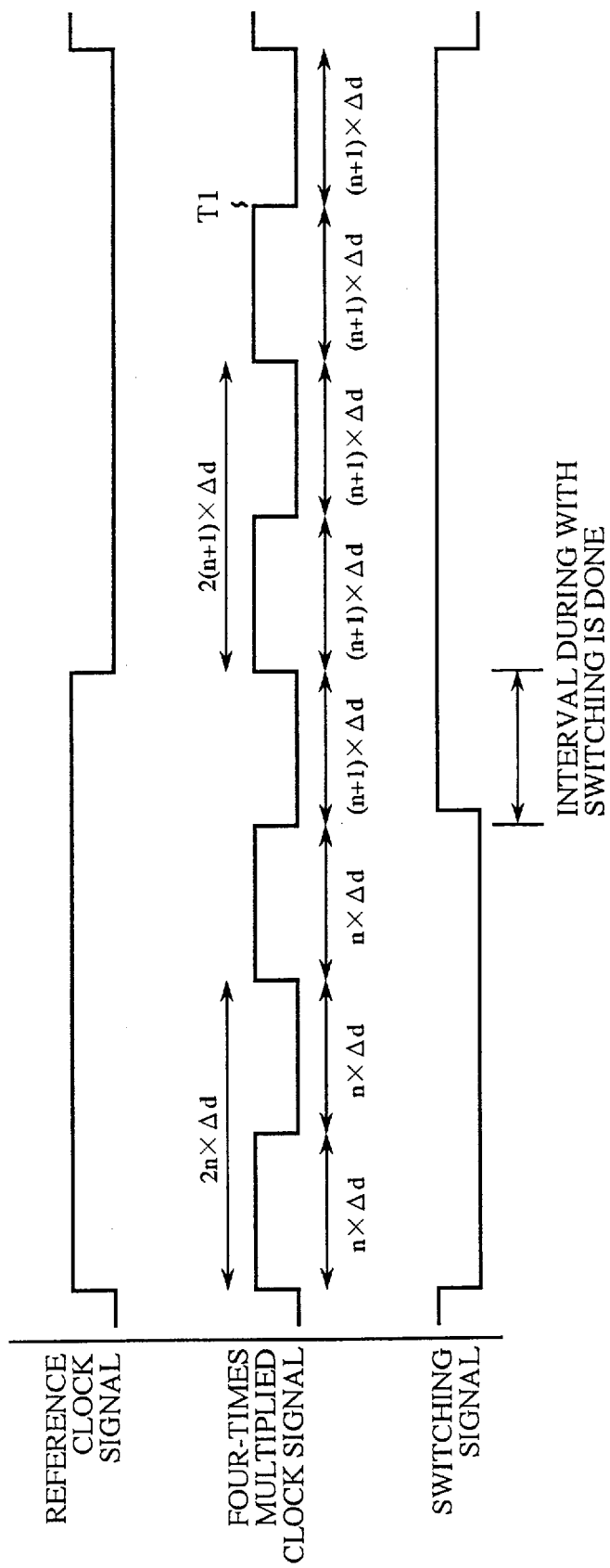
FIG. 13 is a timing diagram showing an example of the operation of prior art oscillation circuitry.
Figure 14:
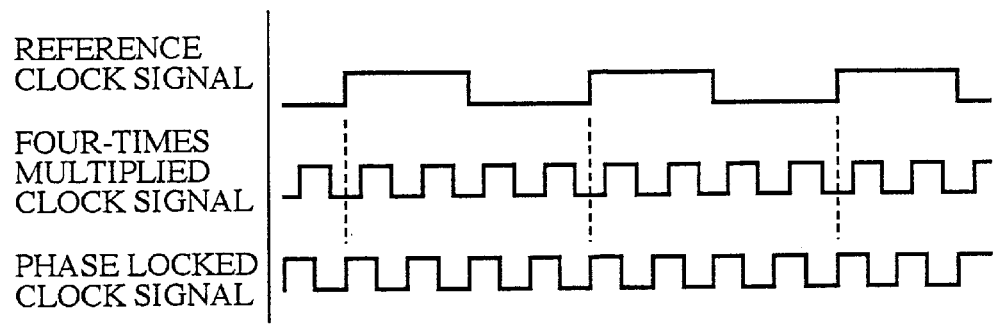
FIG. 14 is a timing diagram showing the mutual timing among multiplied and phase locked clock signals generated by the prior art clock generating circuitry, and a reference clock signal.
Figure 15:
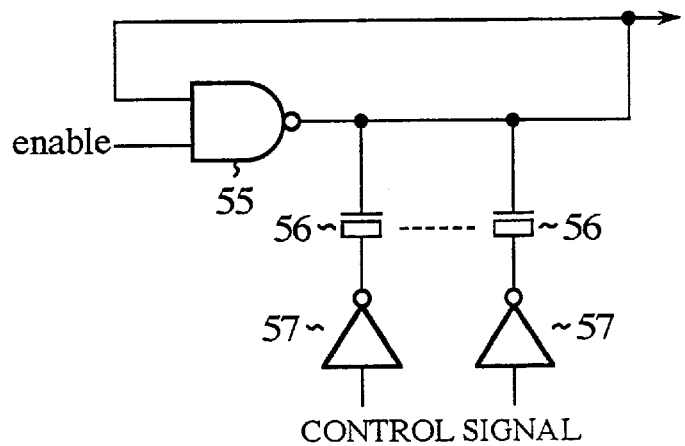
FIG. 15 is a block diagram showing a prior art phase locked loop.

As can be seen from the above description, the clock delay circuit of the present invention can set and provide a time delay in steps of a predetermined time interval which is less than the smallest one of time delays provided by a plurality of fine-delay elements included therein, which cannot be further decreased due to characteristics of transistors included in the plurality of fine-delay elements. The oscillation circuit can make the multiplied clock signal be in synchronization with a reference clock signal applied thereto with a high degree of accuracy by means of the clock delay circuit of the present invention, compared with the case of using the prior art delay adjustment circuit as shown in FIG. 12. In other words, compared with the prior art case where the delay adjustment circuit adjusts a time delay caused by itself in steps of $\Delta d$ of the time delay provided by each delay element, the clock delay circuit of the present invention can finely adjust a time delay caused by itself in delay steps of a predetermined time interval, for example $\Delta d/8$, which is less than the time delays produced by the plurality of fine-delay elements included therein. Accordingly, in the prior art, since the delay adjustment circuit finely adjusts its delay by only one time delay caused by one delay element within one period of an external clock signal applied thereto, the output clock signal furnished by the delay loop including the prior art delay adjustment circuit includes jitter having an amount of $2 \times \Delta d$ inevitably. In contrast, the amount of jitter included in the multiplied clock signal from the multiplication delay loop including the clock delay circuit of the present invention can be reduced to one-half of the delay step of the clock delay circuit, for example $\Delta d/4$.

Furthermore, a difference between the longest and shortest ones of the plurality of time delays provided by the plurality of fine-delay elements included in the clock delay circuit is equal to or less than the smallest variation in the variable time delay provided by the digital delay line connected in series to the clock delay circuit or the delay step of the digital delay line. Accordingly, the combination of the clock delay circuit and the digital delay line has the capability of finely setting and providing a time delay in steps of a predetermined time interval which is obtained by dividing the delay caused by each delay element included in the digital delay line by the number of the plurality of fine-delay elements included in the clock delay circuit, for example, in steps of $\Delta d/8$, throughout the range of the variable time delay provided by the digital delay line. Particularly, although both the clock delay circuit and the digital delay line contained in an integrated circuit are relatively small in scale, the combination of the clock delay circuit and the digital delay line can provide fine delay adjustment, which cannot be offered by the prior art delay adjustment circuit mentioned above, throughout the range of the variable time delay provided by the digital delay line.

The clock delay circuit of the embodiment further includes a limit delay element connected in parallel with the plurality of fine-delay elements thereof, for delaying the same signal as entered into the plurality of fine-delay elements of said clock delay circuit by a specified time delay which is equal to or less than the sum of the smallest variation in the variable time delay provided by the digital delay line or the delay step of the digital delay line and the shortest one of the plurality of time delays provided by the plurality of fine-delay elements included in the clock delay circuit, and means for selecting and furnishing, from one delayed clock signal selected by the selector and the clock signal delayed by the limit delay element, the one which has entered thereto earlier than the other one. Accordingly, the time delay provided by the clock delay circuit does not exceed the sum of the shortest one of the plurality of time delays provided by the plurality of fine-delay elements included in the clock delay circuit and the smallest variation in the variable time delay provided by the digital delay line or the delay step of the digital delay line. This results in avoiding causing a problem, which can result from variations in the temperature of the clock delay circuit, that the total time delay caused by the combination of the clock delay circuit and the digital delay line when the time delay by the clock delay circuit is set to the longest one is greater than that provided when the time delay by the digital delay line is increased by one delay step and the time delay by the clock delay circuit is set to the shortest one. That is, there is not a possibility that the total time delay caused by the combination of the clock delay circuit and the digital delay line is decreased at the instant when all of the lowermost bits of a counter for setting the time delay provided by the clock delay circuit are set to zero after the counter has incremented itself by one so as to increase the time delay by the clock delay circuit. It is therefore ensured that the phase of a clock signal to be controlled is locked with respect to the reference clock signal. Furthermore, it is ensured that the amount of jitter included in the multiplied clock signal from the multiplication delay loop including the clock delay circuit of the present invention is reduced to one-half of the delay step of the clock delay circuit, for example $\Delta d/4$.

The delay setting circuit of the oscillation circuitry includes a counter which can increment or decrement itself according to the phase difference signal from the phase comparator, and causes the selector to change a selection of one delayed clock signal according to the value of lowermost bits of the counter and sets the variable time delay to be provided by the digital delay line according to the value of the remaining highmost bits of the counter. By using the single counter, the oscillation circuit can make a clock signal the frequency of which is multiplied by the delay loop be in synchronization with a reference clock signal applied thereto by changing the time delay provided by the delay loop in steps of a very short time interval. Similarly, the phase synchronization circuit of the present invention can make the four-times multiplied clock signal delivered to each internal circuit built in the integrated circuit be in synchronization with a reference clock signal applied thereto by changing the time delay provided by delay means including a digital delay line and a clock delay circuit of the present invention in steps of a very short time interval by means of a single counter.

Many widely different embodiments of the present invention may be constructed without departing from the spirit and scope of the present invention. It should be understood that the present invention is not limited to the specific embodiment described in the specification, except as defined in the appended claims.

What is claimed is:

1. Clock delay circuitry comprising:
   a plurality of delay elements each for delaying an identical clock signal applied thereto by a specified time delay which differs from other time delays provided by the others of said plurality of delay elements so as to generate a delayed clock signal; and
   a selector for selecting one delayed clock signal from among the plurality of delayed clock signals from said plurality of delay elements;
   the plurality of time delays provided by said plurality of delay elements being set such that a time lag between any two successive delayed clock signals generated by said plurality of delay elements is less than the shortest one of the plurality of time delays provided by said plurality of delay elements;
   whereby the selector is capable of generating time delays which differ by less than the shortest one of the plurality of time delays provided by said plurality of delay elements.

2. The clock delay circuitry according to claim 1, further comprising limit delay element connected in parallel with said plurality of delay elements thereof, for delaying the identical clock signal as entered into said plurality of delay elements by a specified time delay which is slightly greater than the longest one of the plurality of time delays provided by said plurality of delay elements, and means for selecting and furnishing a clock signal which has entered thereto first, said clock signal which has entered thereto first being either one of the one delayed clock signal which has been selected beforehand by said selector, or a clock signal delayed by said limit delay element.

3. The clock delay circuitry according to claim 1, wherein the plurality of time delays provided by said plurality of delay elements are predetermined such that they increase in steps of a length of time obtained by dividing the length of a predetermined time interval by the number of said plurality of delay elements.

4. Oscillation circuitry comprising:
   a delay loop into which a clock signal furnished by itself is fed back, said delay loop including a clock delay circuit provided with a plurality of delay elements each for delaying either a signal associated with the clock signal fed back into said delay loop or the clock signal fed back into said delay loop by a specified time delay which differs from other time delays provided by the others of said plurality of delay elements so as to generate a delayed clock signal, and a selector for selecting one delayed clock signal from among the plurality of delayed clock signals from said plurality of delay elements, the plurality of time delays provided by said plurality of delay elements being set such that a time lag between any two successive delayed clock signals generated by said plurality of delay elements is less than the shortest one of the plurality of time delays provided by said plurality of delay elements;
   a phase comparator for comparing the phase of a signal associated with an output of said delay loop with that of a reference clock signal applied thereto so as to generate a phase difference clock signal indicating the phase difference between them; and
   a delay setting circuit for causing said selector to change a selection of one delayed clock signal according to the phase difference signal from said phase comparator in such a manner as to reduce the phase difference.

5. The oscillation circuitry according to claim 4, wherein said delay loop further includes a digital delay line connected in series to said clock delay circuit and provided with a plurality of delay elements in series, for delaying a signal associated with the clock signal fed back into said delay loop, the clock signal fed back into said delay loop, or the delayed clock signal from said clock delay circuit by a variable time delay, so that the clock signal fed back into said delay loop is delayed by at least the time delays provided by said digital delay line and said clock delay circuit, and wherein said delay setting circuit can also set the variable time delay to be provided by said digital delay line according to the phase difference signal from said phase comparator in such a manner as to reduce the phase difference.

6. The oscillation circuitry according to claim 5, wherein both said plurality of delay elements included in said digital delay line and said plurality of delay elements included in said clock delay circuit are formed using an identical semiconductor process.

7. The oscillation circuitry according to claim 5, wherein a difference between the longest and shortest ones of the plurality of time delays provided by said plurality of delay elements included in said clock delay circuit is equal to or less than the smallest variation in the variable time delay provided by said digital delay line or a smallest time delay provided by said digital delay line.

8. The oscillation circuitry according to claim 7, wherein said clock delay circuit includes a limit delay element connected in parallel with said plurality of delay elements thereof, for delaying the same signal as entered into said plurality of delay elements of said clock delay circuit by a specified time delay which is equal to or less than the sum of the smallest variation of the variable time delay provided by said digital delay line or a smallest time delay provided by said digital delay line and the shortest one of the plurality of time delays provided by said plurality of delay elements included in said clock delay circuit, and means for selecting and furnishing, from one delayed clock signal selected by said selector and the clock signal delayed by said limit delay element, the one which has entered thereto earlier than the other one.

9. The oscillation circuitry according to claim 5, wherein said delay setting circuit includes a counter which can increment or decrement itself according to the phase difference signal from said phase comparator, and causes said selector to change a selection of one delayed clock signal according to the value of lowermost bits of said counter and sets the variable time delay to be provided by said digital delay line according to the value of the remaining highmost bits of said counter.

10. The oscillation circuitry according to claim 9, wherein said selector selects one delayed clock signal from one of said plurality of delay elements which corresponds to the value of the lowermost bits of said counter, and said digital delay line delays the clock signal applied thereto by using one or more delay elements thereof the number of which corresponds to the value of the remaining highmost bits of said counter.

11. The oscillation circuitry according to claim 4, wherein the plurality of times delays provided by said plurality of delay elements included in said clock delay circuit are predetermined such that they increase in steps of a length of time obtained by dividing the length of a predetermined time interval by the number of said plurality of delay elements.

12. Phase synchronous circuitry comprising:
   delay means including a clock delay circuit provided with a plurality of delay elements each for delaying an identical clock signal applied thereto by a specified time delay which differs from other time delays provided by the others of said plurality of delay elements so as to generate a delayed clock signal, and a selector for selecting one delayed clock signal from among the plurality of delayed clock signals generated by said plurality of delay elements, the plurality of time delays provided by said plurality of delay elements being set such that a time lag between any two successive delayed clock signals generated by said plurality of delay elements is less than the shortest one of the plurality of time delays provided by said plurality of delay elements;
   a phase comparator for comparing the phase of either an output of said delay means or a signal associated with the output of said delay means with that of a reference clock signal applied thereto so as to generate a phase difference clock signal indicating the phase difference between them; and
   a delay setting circuit for causing said selector to change a selection of one delayed clock signal according to the phase difference signal from said phase comparator in such a manner as to reduce the phase difference.

13. The phase synchronous circuitry according to claim 12, wherein said delay means further includes a digital delay line connected in series to said clock delay circuit and provided with a plurality of delay elements in series, for delaying either the clock signal or the delayed clock signal from said clock delay circuit by a variable time delay, so that the clock signal applied to said delay means is delayed by at least the time delays provided by said digital delay line and said clock delay circuit, and wherein said delay setting circuit can also set the variable time delay to be provided by said digital delay line according to the phase difference signal from said phase comparator in such a manner as to reduce the phase difference.

14. The phase synchronous circuitry according to claim 13, wherein both said plurality of delay elements included in said digital delay line and said plurality of delay elements included in said clock delay circuit are formed using an identical semiconductor process.

15. The phase synchronous circuitry according to claim 13, wherein a difference between the longest and shortest ones of the plurality of time delays provided by said plurality of delay elements included in said clock delay circuit is equal to or less than the smallest variation in the variable delay provided by said digital delay line or a smallest time delay provided by said digital delay line.

16. The phase synchronous circuitry according to claim 15, wherein said clock delay circuit includes a limit delay element connected in parallel with said plurality of delay elements thereof, for delaying the same clock signal as entered into said plurality of delay elements of said clock delay circuit by a specified time delay which is equal to or less than the sum of the smallest variation in the variable time delay provided by said digital delay line or a smallest time delay provided by said digital delay line and the shortest one of the plurality of time delays provided by said plurality of delay elements included in said clock delay circuit, and means for selecting and furnishing, from one delayed clock signal selected by said selector and the clock signal delayed by said limit delay element, the one which has entered thereto earlier than the other one.

17. The phase synchronous circuitry according to claim 13, wherein said delay setting circuit includes a counter which can increment or decrement itself according to the phase difference signal from said phase comparator, and causes said selector to change a selection of one delayed clock signal according to the value of lowermost bits of said counter and sets the variable time delay to be provided by said digital delay line according to the value of the remaining highmost bits of said counter.

18. The phase synchronous circuitry according to claim 17, wherein said selector selects one delayed clock signal from one of said plurality of delay elements which corresponds to the value of the lowermost bits of said counter, and said digital delay line delays the clock signal applied thereto by using one or more delay elements thereof the number of which corresponds to the value of the remaining highmost bits of said counter.

19. The phase synchronous circuitry according to claim 18, wherein the plurality of times delays provided by said plurality of delay elements included in said clock delay circuit are predetermined such that they increase in steps of a length of time obtained by dividing the length of a predetermined time interval by the number of said plurality of delay elements.

20. Clock delay circuitry comprising:

a plurality of delay elements, each having a different delay time with a smallest difference in delay time between any two of the plurality of delay elements being smaller than the shortest delay element;

a limit delay element having a delay which is slightly larger than largest of the plurality of delay elements, the limit delay element being connected in parallel with each of the plurality of delay elements and receiving an identical clock signal; and selection means for selecting a delayed clock signal from either an output of one of the plurality of delay elements or an output of the limit delay element, wherein the delayed clock signal selected by the selection means may have a delay shorter than the smallest delay of any of the plurality of delay elements.

* * * * *